United States Patent
Feve et al.

(10) Patent No.: US 11,862,927 B2
(45) Date of Patent: Jan. 2, 2024

(54) HIGH RELIABILITY HIGH POWER HIGH BRIGHTNESS BLUE LASER DIODE SYSTEMS AND METHODS OF MAKING THE SAME

(71) Applicant: Nuburu, Inc., Centennial, CO (US)

(72) Inventors: Jean-Philippe Feve, Monument, CO (US); Matthew Silva Sa, Parker, CO (US); Monica Greenlief, Englewood, CO (US); Donald Millick, Greenwood Village, CO (US); Denis Brisson, Castle Rock, CO (US); Nathaniel Dick, Westminster, CO (US); Mark S Zediker, Castle Rock, CO (US)

(73) Assignee: Nuburu, Inc., Centennial, CO (US)

( * ) Notice: Subject to any disclaimer, the term of this patent is extended or adjusted under 35 U.S.C. 154(b) by 318 days.

(21) Appl. No.: 16/780,138

(22) Filed: Feb. 3, 2020

(65) Prior Publication Data
US 2023/0208097 A1 Jun. 29, 2023

Related U.S. Application Data

(60) Provisional application No. 62/800,474, filed on Feb. 2, 2019.

(51) Int. Cl.
*H01S 5/00* (2006.01)
*H01S 3/02* (2006.01)
(Continued)

(52) U.S. Cl.
CPC ............ *H01S 5/0021* (2013.01); *H01S 3/027* (2013.01); *H01S 5/02224* (2013.01);
(Continued)

(58) Field of Classification Search
CPC .... H01S 5/0021; H01S 3/027; H01S 5/02224; H01S 5/4087; H01S 3/0071; H01S 3/2383; H01S 5/0225; H01S 5/4031
See application file for complete search history.

(56) References Cited

U.S. PATENT DOCUMENTS

| 4,288,678 A | 9/1981 | LaRocca |
| 4,679,198 A | 7/1987 | Shone |
| | (Continued) | |

FOREIGN PATENT DOCUMENTS

| EP | 1 760 849 | 3/2007 |
| EP | 20747747.2 | 11/2022 |
| | (Continued) | |

OTHER PUBLICATIONS

2005, Geert Verhaeghe, The effect on spot size and laser beam quality on welding performance when using high-power continuous wave solid-state lasers.

(Continued)

*Primary Examiner* — M. A. Golub-Miller
(74) *Attorney, Agent, or Firm* — Belvis Law, LLC.; Glen P. Belvis

(57) ABSTRACT

There are provided high power, high brightness solid-state laser systems that maintain initial beam properties, including power levels, and do not have degradation of performance or beam quality, for at least 10,000 hours of operation. There are provided high power, high brightness solid-state laser systems containing Oxygen in their internal environments and which are free from siloxanes.

9 Claims, 11 Drawing Sheets

(51) Int. Cl.
  *H01S 5/02224*   (2021.01)
  *H01S 5/0225*    (2021.01)
  *H01S 5/40*      (2006.01)
  *H01S 3/23*      (2006.01)
  *H01S 3/00*      (2006.01)

(52) U.S. Cl.
  CPC .......... *H01S 5/4087* (2013.01); *H01S 3/0071* (2013.01); *H01S 3/2383* (2013.01); *H01S 5/0225* (2021.01); *H01S 5/4031* (2013.01)

(56) References Cited

U.S. PATENT DOCUMENTS

| | | |
|---|---|---|
| 4,847,479 A | 7/1989 | Clark |
| 4,857,699 A | 8/1989 | Duley |
| 4,879,449 A | 11/1989 | Duley |
| 4,930,855 A | 6/1990 | Clark |
| 4,960,973 A | 10/1990 | Fouch |
| 4,973,819 A | 11/1990 | Thatcher |
| 5,127,019 A | 6/1992 | Epstein |
| 5,379,310 A | 1/1995 | Papen |
| 5,392,308 A | 2/1995 | Welch |
| 5,502,292 A | 3/1996 | Pernicka |
| 5,526,155 A | 6/1996 | Knox |
| 5,578,227 A | 11/1996 | Rabinovich |
| 5,578,863 A * | 11/1996 | De Poorter .......... H01S 5/0021 257/432 |
| 5,808,803 A | 9/1998 | Uliman |
| 5,903,583 A | 5/1999 | Uliman |
| 5,923,475 A | 7/1999 | Kurtz |
| 5,986,794 A | 11/1999 | Krause |
| 5,987,043 A | 11/1999 | Brown |
| 6,028,722 A | 2/2000 | Lang |
| 6,124,973 A | 9/2000 | Du |
| 6,129,884 A | 10/2000 | Beers |
| 6,151,168 A | 11/2000 | Goering |
| 6,175,452 B1 | 1/2001 | Uilmann |
| 6,191,383 B1 | 2/2001 | Jense |
| 6,192,062 B1 | 2/2001 | Sanchez-Rubio |
| 6,208,679 B1 | 3/2001 | Sanchez-Rubio |
| 6,212,310 B1 | 4/2001 | Waarts |
| 6,251,328 B1 | 6/2001 | Beyer |
| 6,331,692 B1 | 10/2001 | Krausse |
| 6,327,292 B1 | 12/2001 | Sanchez-Fubio |
| 6,575,863 B2 | 6/2003 | Piltch |
| 6,584,133 B1 | 6/2003 | Walker |
| 6,591,040 B1 | 7/2003 | Dempewolf |
| 6,876,679 B1 * | 4/2005 | Bowler .............. G02B 6/29365 372/101 |
| 7,001,467 B2 | 2/2006 | Pique |
| 7,006,549 B2 | 2/2006 | Anikitchev |
| 7,034,992 B2 | 4/2006 | Komine |
| 7,110,425 B2 * | 9/2006 | Yamanaka ............ H01S 5/4012 372/5 |
| 7,226,222 B2 * | 6/2007 | Nagano ................ G02B 6/4248 385/94 |
| 7,233,442 B1 | 6/2007 | Brown |
| 7,570,856 B1 | 8/2009 | Minelly |
| 7,765,022 B2 | 7/2010 | Mazumder |
| 7,959,353 B2 | 6/2011 | Anatharaman |
| 8,049,966 B2 | 11/2011 | Chann |
| 8,130,807 B2 | 3/2012 | Schulz-Harder |
| 8,488,245 B1 | 7/2013 | Chann |
| 8,520,311 B2 | 8/2013 | Krause |
| 8,553,327 B2 | 10/2013 | Chann |
| 8,559,107 B2 | 10/2013 | Chann |
| 8,670,180 B2 | 3/2014 | Chann |
| 8,724,222 B2 | 5/2014 | Chann |
| 8,817,831 B1 * | 8/2014 | Terraciano .............. H01S 3/027 372/100 |
| 9,093,822 B1 | 7/2015 | Chann |
| 9,172,208 B1 | 10/2015 | Dawson |
| 9,104,029 B2 | 11/2015 | Tayebati |
| 9,178,333 B2 | 11/2015 | Tayebati |
| 9,190,807 B2 | 11/2015 | Tayebati |
| 9,203,209 B2 | 12/2015 | Ramachandran |
| 9,209,605 B1 | 12/2015 | Guo |
| 9,256,073 B2 | 2/2016 | Chann |
| 9,268,097 B2 | 2/2016 | Huang |
| 9,268,142 B2 | 2/2016 | Chann |
| 9,310,560 B2 * | 4/2016 | Chann .................. G02B 6/2817 |
| 2001/0023921 A1 | 9/2001 | Mano |
| 2002/0149137 A1 | 10/2002 | Jang |
| 2003/0048819 A1 | 3/2003 | Nagano |
| 2003/0052105 A1 | 3/2003 | Nagano |
| 2003/0063631 A1 | 4/2003 | Corcoran |
| 2003/0103545 A1 * | 6/2003 | Julliard ................... H01S 3/025 372/109 |
| 2003/0142393 A1 | 7/2003 | Kuksenkov |
| 2003/0214987 A1 * | 11/2003 | Yamanaka ............ H01S 5/4012 372/36 |
| 2003/0227957 A1 * | 12/2003 | Pang .................. B01D 53/8675 372/59 |
| 2004/0027631 A1 | 2/2004 | Nagano |
| 2004/0036242 A1 | 2/2004 | DiStaulo |
| 2004/0056006 A1 | 3/2004 | Jones |
| 2004/0086004 A1 | 5/2004 | Bonaccini |
| 2004/0156401 A1 | 8/2004 | Sandrock |
| 2004/0173587 A1 | 9/2004 | Musselman |
| 2004/0184753 A1 * | 9/2004 | Teramura ........... G02B 6/02395 385/94 |
| 2004/0254474 A1 | 12/2004 | Seibel |
| 2005/0153478 A1 * | 7/2005 | Yoshida .................. H01S 5/024 438/106 |
| 2005/0173385 A1 | 8/2005 | Smart |
| 2005/0207466 A1 | 9/2005 | Glebov |
| 2005/0242359 A1 * | 11/2005 | Yoshida ............... H01S 5/02212 257/99 |
| 2005/0248820 A1 | 11/2005 | Moser |
| 2006/0018609 A1 * | 1/2006 | Sonoda ................ G02B 6/4204 385/94 |
| 2006/0160332 A1 | 7/2006 | Gu |
| 2007/0029571 A1 * | 2/2007 | Hanaoka ............... H01L 33/483 257/E33.059 |
| 2007/0041083 A1 | 2/2007 | Di Teodoro |
| 2007/0147449 A1 * | 6/2007 | Bessho ............... H01S 5/02212 372/49.01 |
| 2008/0085368 A1 | 4/2008 | Abe |
| 2009/0051935 A1 | 2/2009 | Cooper |
| 2009/0190218 A1 | 7/2009 | Govorkov |
| 2009/0225793 A1 | 9/2009 | Marciante |
| 2010/0110556 A1 | 5/2010 | Chann |
| 2010/0290106 A1 | 11/2010 | Digiovanni |
| 2011/0122482 A1 | 5/2011 | Mead |
| 2011/0129615 A1 | 6/2011 | Renn |
| 2011/0205349 A1 | 8/2011 | Li |
| 2011/0216792 A1 | 9/2011 | Chann |
| 2011/0267671 A1 | 11/2011 | Peng |
| 2011/0311389 A1 | 12/2011 | Ryan |
| 2012/0012570 A1 | 1/2012 | Briand |
| 2012/0285936 A1 | 11/2012 | Urashima |
| 2013/0028276 A1 * | 1/2013 | Minelly ............... H01S 3/06704 372/6 |
| 2013/0071738 A1 | 3/2013 | Wang |
| 2013/0148673 A1 | 6/2013 | Creeden |
| 2013/0162952 A1 | 6/2013 | Lippey et al. |
| 2013/0269748 A1 | 10/2013 | Wiedeman et al. |
| 2014/0023098 A1 | 1/2014 | Clarkson |
| 2014/0086539 A1 * | 3/2014 | Goutain ................ G02B 6/4214 385/89 |
| 2014/0112357 A1 | 4/2014 | Abedin |
| 2014/0249495 A1 | 9/2014 | Mumby et al. |
| 2014/0252687 A1 | 9/2014 | El-Dasher |
| 2015/0033343 A1 | 1/2015 | Jiang |
| 2015/0136840 A1 | 5/2015 | Zhao |
| 2015/0165556 A1 | 6/2015 | Jones et al. |
| 2015/0333473 A1 | 11/2015 | Gapontsev |
| 2016/0067780 A1 * | 3/2016 | Zediker ................. B23K 26/342 219/76.12 |
| 2016/0067827 A1 * | 3/2016 | Zediker ................. B23K 26/342 219/76.12 |
| 2016/0322777 A1 * | 11/2016 | Zediker ..................... H01S 3/30 |

(56) References Cited

U.S. PATENT DOCUMENTS

| | | |
|---|---|---|
| 2016/0336714 A1 | 11/2016 | Zimer |
| 2017/0021454 A1 | 1/2017 | Dallarosa |
| 2017/0021455 A1 | 1/2017 | Dallarosa |
| 2017/0191314 A1* | 7/2017 | Faircloth ................. E21B 37/00 |
| 2017/0336714 A1 | 11/2017 | Arnz et al. |
| 2017/0341144 A1* | 11/2017 | Pelaprat ............... B23K 26/082 |
| 2017/0341180 A1* | 11/2017 | Zediker .................. B23K 26/21 |
| 2017/0343729 A1 | 11/2017 | Zediker et al. |
| 2018/0191129 A1* | 7/2018 | Wheeler ............. H01S 5/02235 |
| 2018/0236605 A1* | 8/2018 | Finuf ...................... B23K 26/26 |
| 2018/0375296 A1* | 12/2018 | Zediker ................ H01S 5/4062 |
| 2019/0025502 A1 | 1/2019 | Zediker et al. |
| 2019/0089983 A1 | 3/2019 | Choe et al. |
| 2019/0273365 A1* | 9/2019 | Zediker ............ H01S 3/094046 |
| 2019/0361171 A1 | 11/2019 | Lee |
| 2020/0086388 A1 | 3/2020 | Zediker et al. |
| 2020/0094478 A1 | 3/2020 | Zediker et al. |
| 2021/0399519 A1* | 12/2021 | Zediker ................ H01S 5/0021 |
| 2022/0140572 A1* | 5/2022 | Feve .................... H01S 5/4087 |
| | | 372/50.121 |

FOREIGN PATENT DOCUMENTS

| | | | | |
|---|---|---|---|---|
| JP | 11-054852 | | 2/1999 | |
| JP | 2003298170 A | * | 10/2003 | ........... H01S 5/4012 |
| TW | 200416420 A | * | 9/2004 | ........... G02B 6/3849 |
| WO | WO 2018/231884 | | 12/2018 | |
| WO | PCT/US20/16403 | | 6/2020 | |
| WO | PCT/WO20/16403 | | 6/2020 | |
| WO | WO-2021076706 A1 | * | 4/2021 | ............. B23K 26/00 |

OTHER PUBLICATIONS

Mar. 1, 2018, Dolgov, Plasma-Assisted Cleaning of Extreme UV Optics.

2015, Chen, Research on all-sold-state blue lasers.

2018, Silva, Blue Laser Diode (450 nm) Systems for Welding Copper.

Apr. 2019, Nuburu, The First Industrial Blue Lase is Changing the Game.

* cited by examiner

HIGH RELIABILITY HIGH POWER HIGH BRIGHTNESS BLUE LASER DIODE SYSTEMS AND METHODS OF MAKING THE SAME

This application claims priority to, and under 35 U.S.C. § 119(e)(1) the benefit of the filing date of, U.S. provisional application Ser. No. 62/800,474 filed Feb. 2, 2019, the entire disclosure of which is incorporated herein by reference.

BACKGROUND OF THE INVENTION

Field of the Invention

The present inventions relate to high power laser systems that provide lower wavelength, about 10 nm to about 600 nm, and in embodiments generally about 350 nm to about 500 nm, wavelength laser energy, and uses for these systems and laser beams, including additive and subtractive manufacturing, materials processing and laser welding applications. The present inventions further relate to such laser systems, and their applications, that provide laser beams having excellent beam quality, and which, in embodiments, maintain high quality and high power laser beams over extended periods of time.

Infrared red (IR) based (e.g., having wavelengths greater than 700 nm, and in particular wavelengths greater than 1,000 nm) additive manufacturing systems suffer from, among other things, two short comings, which limit both the build volume and the build speed.

As used herein, unless expressly stated otherwise, "UV", "ultra violet", "UV spectrum", and "UV portion of the spectrum" and similar terms, should be given their broadest meaning, and would include light in the wavelengths of from about 10 nm to about 400 nm, and from 10 nm to 400 nm, and all wavelengths coming within these ranges.

As used herein, unless expressly stated otherwise, the terms "laser diode", "diode emitter", "laser diode bar", "laser diode chip", and "emitter" and similar such terms are to be given their broadest meaning. Generally, the laser diodes is a semiconductor device that emits a laser beam, such devices are commonly referred to as edge emitting laser diodes because the laser light is emitted from the edge of the substrate. Typically, diode Lasers with a single emission region (Emitter) are typically called laser diode chips, while a linear array of emitters is called laser diode bars. The area emitting the laser beam is referred to as the "facet."

As used herein, unless expressly stated otherwise, the terms "high power", lasers and laser beams and similar such terms, mean and include laser beams, and systems that provide or propagate laser beams that have at least 100 Watts (W) of power as well as greater powers, for example from 100 Watts to 10 kW (kilowatts), from about 100 W to about 1 kW, from about 500 W to about 5 kW, from about 10 kw to about 40 kW, from about 5 kW to about 100 kW, and all powers within these ranges, as well as higher powers.

As used herein, unless expressly stated otherwise, the terms "blue laser beams", "blue lasers" and "blue" should be given their broadest meaning, and in general refer to systems that provide laser beams, laser beams, laser sources, e.g., lasers and diodes lasers, that provide, e.g., propagate, a laser beam, or light having a wavelength from about 400 nm to about 495 nm, from 400 nm to 495 nm, and all wavelengths within these ranges. Typical blue lasers have wavelengths in the range of about 405-495 nm. Blue lasers include wavelengths of 450 nm, of about 450 nm, of 460 nm, of about 470 nm. Blue lasers can have bandwidths of from about 10 pm (picometer) to about 10 nm, about 5 nm, about 10 nm and about 20 nm, as well as greater and smaller values.

As used herein, unless expressly stated otherwise, the terms "green laser beams", "green lasers" and "green" should be given their broadest meaning, and in general refer to systems that provide laser beams, laser beams, laser sources, e.g., lasers and diodes lasers, that provide, e.g., propagate, a laser beam, or light having a wavelength from about 500 nm to about 575 nm. Green lasers include wavelengths of 515 nm, of about 515 nm, of 532 nm, about 532 nm, of 550 nm, and of about 550 nm. Green lasers can have bandwidths of from about 10 pm to 10 nm, about 5 nm, about 10 nm and about 20 nm, as well as greater and smaller values.

As used herein, unless expressly stated otherwise, the terms "high reliability", "highly reliable", lasers and laser systems and similar terms, mean and include lasers which have a lifetime of at least 10,000 hours or greater, about 20,000 hrs, about 50,000 hours, about 100,000 hours, from about 10 hours to about 100,000 hours, from 10,000 to 20,000 hours, from 10,000 hours to 50,000 hours, from 20,000 hours to about 40,000 hours, from about 30,000 hours to about 100,000 hours and all values within these ranges.

As used herein, unless expressly stated otherwise, the terms "lifetime", "system lifetime, and "extended lifetime" and similar such terms, are defined as the time during which the output power, other properties, and both of the laser stay at or near a percentage of its nominal value ("nominal value" is the greater of (i) the laser's rated power, other properties, and both, as defined or calculated by the manufacturer, or (ii) the initial power, other properties, and both, of the laser upon first use, after all calibrations and adjustments have been performed). Thus, for example, an "80% laser lifetime" is defined as the total operating time when the laser power, other properties, and both remains at 80% of the nominal value. For example, a "50% laser lifetime" is defined as the total operating time when the laser power, other properties, and both remains at 50% of the nominal value. As used herein, unless specified otherwise or otherwise clear from the context, the term "lifetime" as used herein is referring to an "80% life time".

Generally, the term "about" and the symbol "~" as used herein, unless specified otherwise, is meant to encompass a variance or range of ±10%, the experimental or instrument error associated with obtaining the stated value, and preferably the larger of these.

As used herein, unless expressly stated otherwise terms such as "at least", "greater than", also mean "not less than", i.e., such terms exclude lower values unless expressly stated otherwise.

As used herein, unless stated otherwise, room temperature is 25° C. And, standard temperature and pressure is 25° C. and 1 atmosphere. Unless expressly stated otherwise all tests, test results, physical properties, and values that are temperature dependent, pressure dependent, or both, are provided at standard temperature and pressure.

As used herein, unless specified otherwise, the recitation of ranges of values, a range, from about "x" to about "y", and similar such terms and quantifications, serve as merely shorthand methods of referring individually to separate values within the range. Thus, they include each item, feature, value, amount or quantity falling within that range. As used herein, unless specified otherwise, each and all individual points within a range are incorporated into this specification, and are a part of this specification, as if they were individually recited herein.

This Background of the Invention section is intended to introduce various aspects of the art, which may be associated with embodiments of the present inventions. Thus, the foregoing discussion in this section provides a framework for better understanding the present inventions, and is not to be viewed as an admission of prior art.

SUMMARY

There is a continuing and increasing need for more reliable high power blue, and other wavelength, solid-state lasers and system, including laser diode systems for a variety of applications ranging from welding, additive manufacturing, and other materials processing where infrared lasers have several shortcomings described in prior art. This continuing need for such lasers and laser systems, in part, is to improve upon and replace existing infrared laser systems and to provide new laser applications that were incapable or uneconomical for infrared laser systems. Furthermore, there is a need for highly reliable high-power blue lasers, and other wave lengths, for utilizing these systems in industrial applications.

The present inventions, among other things, solve these needs by providing the improvements, articles of manufacture, devices and processes taught, and disclosed herein.

Thus, there is provided a high power, high brightness solid-state laser assembly for providing a high-quality laser beam over long periods of time without substantial degradation of the laser beam properties, the assembly having: a housing the housing defining an internal cavity; wherein the internal cavity is isolated from an environment that is external to the housing; a solid-state device for propagating a laser beam from a propagation surface of the solid-state device along a laser beam path, and wherein the laser beam has a power density of at least about 0.5 MW/cm$^2$ at the propagation surface; an optics assembly, the optics assembly in optical communication with the solid-state device and on the laser beam path; wherein the solid-state device and the optics assembly are located within the housing and in the internal cavity, whereby the solid-state device and the optics assembly are isolated from the external environment; the housing comprising a housing propagation surface, whereby the laser beam is transmitted from the housing into the external environment along the laser beam path; the housing propagation surface in optical communication with the optics assembly and on the laser beam path; the laser beam upon exiting the housing propagation surface characterized by beam properties, the beam properties comprising: (i) a power of at least 100 W; and, (ii) a BPP of less than 100 mm-mrad; and, the internal cavity being free from sources of silicon based contaminates, whereby during operation of the solid-state device SiO$_2$ production within the internal cavity is avoided; whereby the internal cavity avoids SiO$_2$ build up; thereby the degradation rate of the beam properties is 2.3% per khrs or less.

Further, there is provided a high power, high brightness solid-state laser assembly, for providing a high-quality blue laser beam over long periods of time without substantial degradation of the laser beam properties, the assembly having: a housing, the housing defining an internal cavity; wherein the internal cavity is isolated from an environment that is external to the housing; a plurality of diode laser devices, for propagating a plurality of laser beams, from a plurality of facets, along a plurality of diode laser beam paths, wherein the laser beams have a wavelength in the range of 400 nm to 500 nm; and wherein each laser beam has a power density of at least about 0.5 MW/cm$^2$ at each of the facets; an optics assembly, the optics assembly in optical communication with each of the diode laser devices and on the laser beam paths; the optics assembly comprising collimating optics, e.g., collimating optic, and beam combining optics; the optics assembly combining the plurality of diode laser beams to provide a combined laser beam along a combined laser beam path\; wherein the plurality of diode laser devices and the optics assembly are located within the housing 526 and in the internal cavity, whereby the plurality of diode laser devices and the optics assembly are isolated from the external environment; the housing comprising a housing propagation surface, whereby the combined laser beam is transmitted from the housing into the external environment along the combined laser beam path; the housing propagation surface in optical communication with the optics assembly and on the combined laser beam path; the combined laser beam upon exiting the housing propagation surface characterized by beam properties, the beam properties comprising: (i) a power of at least 100 W; and, (ii) a BPP of less than 40 mm mrad; and, the internal cavity being free from sources of silicon based contaminates, whereby during operation of the plurality of diode laser devices SiO$_2$ is not produced within the internal cavity; whereby the internal cavity avoids SiO$_2$ build up; thereby the degradation rate of the combined beam properties is 2.3% per khrs or less.

Still further there is provided a high power, high brightness solid-state laser assembly 600, for providing a high-quality blue laser beam along a laser beam path over long periods of time without substantial degradation of the laser beam properties, the assembly having: a housing, the housing defining an internal cavity; wherein the internal cavity defines an isolated environment; a plurality of optically active surfaces, wherein a blue laser beam is propagated from, transmitted into or reflected by the optically active surfaces; the plurality of optically active surfaces located within the isolated environment of the internal cavity of the housing; at least one of the optically active surfaces being located on a solid-state laser device; wherein the laser beam has a power density of at least about 0.5 MW/cm$^2$ at one or more of the optically active surfaces, and, the internal cavity being free from sources of silicon based contaminates, whereby during operation of the solid-state laser device SiO$_2$ production is avoided within the internal cavity; wherein the internal cavity comprises a gas comprising Oxygen; whereby during operation of the solid-state laser device CO$_2$ is created within the internal cavity from carbon based contaminates; whereby the plurality of optically active surfaces avoids carbon and SiO$_2$ build up; thereby the degradation rate of a power of the blue laser beam is 2.3% per khrs or less.

Further, there is provided a high power, high brightness solid-state laser device package, for integration into laser systems providing a high-quality blue laser beam over long periods of time without substantial degradation of the laser beam properties, the package having: a housing, the housing defining an internal cavity; wherein the internal cavity is isolated from an environment that is external to the housing; the housing having a window, wherein the window defines a portion of the internal cavity; a solid-state device for propagating a laser beam from a propagation surface of the solid-state device along a laser beam path, wherein the laser beam has a wavelength in the range of 410 nm to 500 nm; and wherein the laser beam has a power density of at least about 0.5 MW/cm$^2$ at the propagation surface; the window in optical communication with the solid-state device and on the laser beam path; wherein the solid-state device is located within the housing and in the internal cavity and wherein an inner surface of the window is not exposed to the external environment, whereby the solid-state device and the inner surface of the window are isolated from the external environment; whereby the laser beam is transmitted from the housing through the window into the external environment along the laser beam path; the internal cavity being free from sources of silicon based contaminates, whereby during operation of the solid-state device $SiO_2$ production within the internal cavity is avoided; whereby the internal cavity avoids $SiO_2$ buildup; thereby the degradation rate of the beam properties is 2.3% per khrs or less; and, wherein the internal cavity has a gas that is at least 1% Oxygen; whereby during operation of the plurality of diode laser devices $CO_2$ is created within the internal cavity from carbon based contaminates, whereby the propagation surface and an internal surface of the window remain free of Carbon buildup.

Moreover there are provided these systems and methods having one or more of the following features: whereby during operation of the solid-state device $SiO_2$ is not produced within the internal cavity; whereby during operation of the solid-state laser $SiO_2$ is essentially not produced, such that the internal cavity is free from $SiO_2$; wherein during operation the internal cavity remains free from $SiO_2$; wherein the internal cavity is free from $SiO_2$; whereby during operation of the solid-state device Carbon deposits are not produced within the internal cavity; whereby during operation of the solid-state laser Carbon deposits are essentially not produced, such that the internal cavity is free from Carbon deposits; wherein during operation the internal cavity remains free from Carbon deposits; wherein the internal cavity is free from Carbon deposits; wherein the system has tens, hundreds or thousands of laser diodes, wherein the systems have laser diodes emitting laser beams in the blue wavelength; wherein the systems have laser diodes emitting laser beams in the wavelength of from about 500 nm and shorter; wherein the systems have laser diodes emitting laser beams in the wavelength of from about 500 nm to about 10 nm; wherein the BPP of the laser beam is less than about 100 mm mrad; wherein the BPP of the laser beam is less than about 50 mm mrad; wherein the BPP of the laser beam is less than about 40 mm mrad; wherein the BPP of the laser beam is less than about 20 mm mrad; wherein the BPP of the laser beam is less than about 15 mm mrad; wherein the systems have laser diodes emitting laser beams in the wavelength of from 500 nm to 10 nm; wherein the laser beams have a band width of about 20 nm or less, about 5 nm or less, about 1 nm or less, and about 0.5 nm or less, a band width from about 20 nm to about 0.5 nm and all band widths within these ranges; wherein the laser systems has focusing optics; wherein the laser system has collimating optics; wherein the laser systems has scanners; and, wherein the laser system has gratings; wherein the laser system has reflective optics, wherein the laser system has Volume Bragg Gratings (VBG), Bragg gratings, etalons, prisms, variable attenuators, shutters optical fibers, graded index lenses, lenses, cylindrical lenses, waveplates, polarization combiner cube, monolithic optical combiner assemblies, Raman crystals, doubling crystals, dielectric mirror assemblies, beam pickoff assemblies, power monitoring assemblies; wherein the internal cavity has a gas that has at least 10% Oxygen, whereby during operation of the solid-state device $CO_2$ is created within the internal cavity from carbon based contaminates; whereby the propagation surface of the solid-state device and the optics assembly avoids Carbon buildup; and wherein the internal cavity has a gas that has at least 1% Oxygen, whereby during operation of the solid-state device $CO_2$ is created within the internal cavity from carbon based contaminates; whereby the propagation surface of the solid-state device and the optics assembly avoids Carbon buildup.

Moreover there are provided these systems and methods having one or more of the following features: Further, there is provided a high power, high brightness solid-state laser device package, for integration into laser systems providing a high-quality blue laser beam over long periods of time without substantial degradation of the laser beam properties, the package having: a housing, the housing defining an internal cavity; wherein the internal cavity is isolated from an environment that is external to the housing; the housing having a window, wherein the window defines a portion of the internal cavity; a solid-state device for propagating a laser beam from a propagation surface of the solid-state device along a laser beam path, wherein the laser beam has a wavelength in the range of 410 nm to 500 nm; and wherein the laser beam has a power density of at least about 0.5 MW/cm$^2$ at the propagation surface; the window in optical communication with the solid-state device and on the laser beam path; wherein the solid-state device is located within the housing and in the internal cavity and wherein an inner surface of the window is not exposed to the external environment, whereby the solid-state device and the inner surface of the window are isolated from the external environment; whereby the laser beam is transmitted from the housing through the window into the external environment along the laser beam path; the internal cavity being free from sources of silicon based contaminates, whereby during operation of the solid-state device $SiO_2$ production within the internal cavity is avoided; whereby the internal cavity avoids $SiO_2$ buildup; thereby the degradation rate of the beam properties is 2.3% per khrs or less; and, wherein the internal cavity has a gas that is at least 1% Oxygen; whereby during operation of the plurality of diode laser devices $CO_2$ is created within the internal cavity from carbon based contaminates, whereby the propagation surface and an internal surface of the window remain free of Carbon buildup.

DESCRIPTION OF THE PREFERRED EMBODIMENTS

Figure 1:
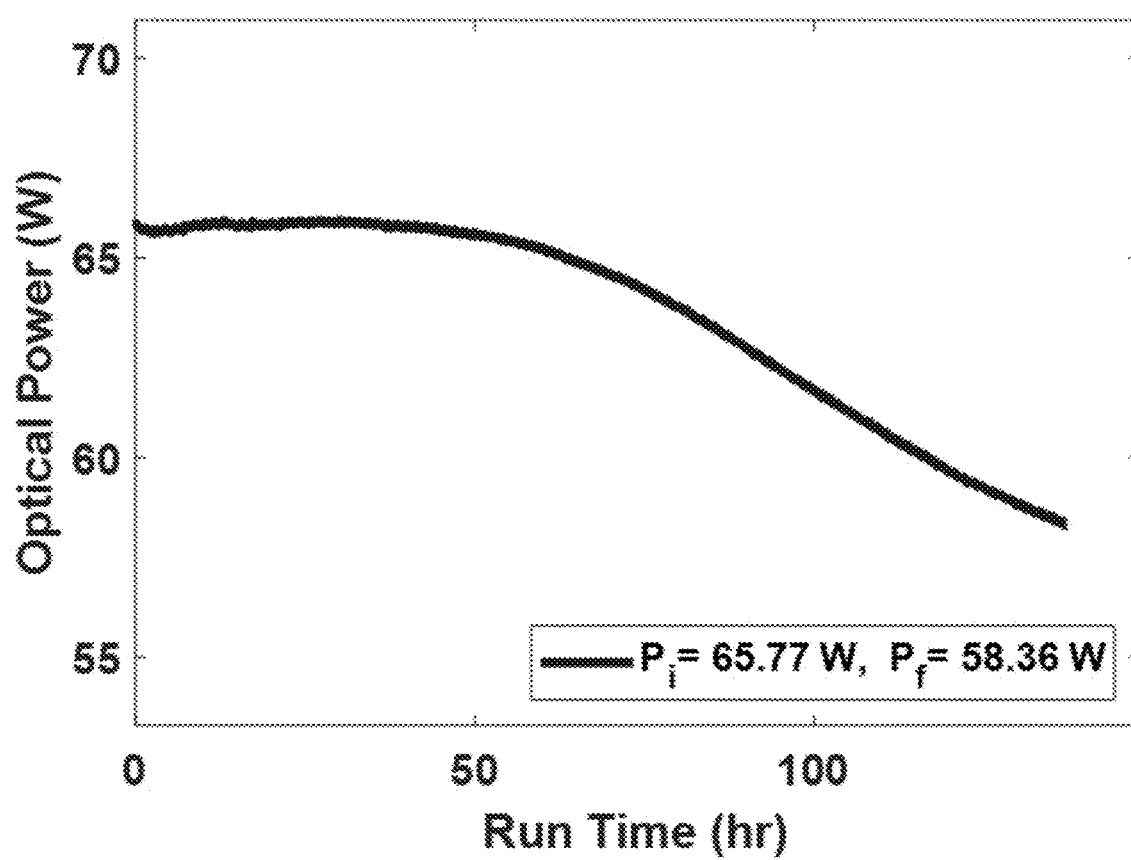
FIG. 1. Is a graph of output power vs time, providing a degradation curve showing the degradation rate, for a high power blue laser system without using the embodiments of the present inventions for assembling, cleaning and packaging. The system of FIG. 1 contains sources of silicon based contaminates and thus is not free from sources of silicon based contaminates.

The present inventions generally relate to lasers that produce laser beams of high quality and high reliability in the blue wavelength ranges. In embodiments, there is generally provided laser systems, and solid-state laser packaging for such systems, in the wavelength range of about 400 nm to about 500 nm.

Although this Specification primarily focusses on wavelengths of 500 nm, this is merely illustrative, it being understood that the packaging, assembly techniques, and cleaning techniques provided are applicable to blue-green, green, shorter wavelength, and potentially other wavelength laser systems, and in particular, high brightness, high power systems.

Typically, the output power of blue laser diode emitters is generally about 5 W per diode, and typically less than 10 W per diode, although higher powers may be possible. High power blue laser systems are obtained by combining beams from multiple emitters, e.g., diodes. The combination of these blue laser beams can be from single emitters, bars of emitters and combinations and variations of these. The laser beams from these emitters are combined by using, for example, combinations of spatial, spectral, coherent and polarization methods. Examples of these beam combining systems are taught and disclosed in US Patent Publication Nos. 2016/0322777, 2018/0375296, 2016/0067827 and 2019/0273365, and U.S. patent application Ser. Nos. 16/695,090 and 16/558,140, the entire disclosure of each of which is incorporated herein by reference.

Generally, the combination of these beams from the multiple emitters, involves the use of passive optical elements to collimate and combine the beams, such as lenses, mirrors, gratings, waveplates. Raman conversion may also be used for beam combination. High brightness sources are needed for most industrial applications such as welding, brazing or additive manufacturing; these typically have a very short focal length lens placed in close proximity to the laser emitter, inside the same package. In the following, the components in the package refer to any element that forms the laser assembly; they are grouped as the optically functional components (like lenses, gratings, mirrors, waveplates, windows), the mechanical components (such as package housing, spacers, mounts) and the positioning components (for example adhesives, solders, mechanical hardware).

Laser diode manufacturers have made advances in the design and manufacturing of blue laser diodes to ensure high reliability of the emitters themselves. In the same way, reliable dielectric coatings are available that provide the desired reflectivity at the blue wavelength while being compatible with the typical intensity of the blue laser diode sources. However, prior to the present inventions, high power blue laser diode systems lacked the level of reliability required for use in industrial applications, and in particular for cost effective use in industrial applications. It has been discovered that this results from the presences of sources of Silicon and Carbon based contaminants that are typically introduced into the system during assembly of the system; and which, as discussed below, have the potential during laser operation to form deposits on the active optical surfaces of the system.

It has been discovered that a limiting factor, and in embodiments the main limiting factors for the lifetime of high-power blue laser diode systems are related to packaging of the system and in particular of the diode, the optical assembly and both the diode and optical assembly. Contamination by volatile organic compounds, like hydrocarbons or poly-siloxanes, can result from outgassing of adhesives, or other materials in the package. Other common sources of contamination include airborne contaminants present in the environment during the assembly process, residues from storage containers of any of the components, surface contaminants present on the tools used for the process, and in general any surface that comes in contact with any of the materials used in the package. In general, it is presently believed that any organic compound that has a vapor pressure sufficient to generate trace amounts of gaseous contaminants in the range of temperature associated with normal operation of the laser is potentially harmful to laser system reliability. It is theorized that the short wavelength of the blue lasers, and shorter wavelength lasers, allows two-photon processes to efficiently generate reactive species in the package, like atomic oxygen, hydroxyls, or ozone. These reactive species then have a gas phase reaction with the volatile organic contaminants leading to deposits or buildup of various solids on optical surfaces in the beam path, i.e., optically active surfaces, which increases the optical losses, reduces the system output, and degrades the properties of the laser beam over time. It is theorized that these deposits and buildup reduce, and greatly reduce, the lifetime of a system. It is further theorized that these deposits and buildup are a primary reason for reaching the end of the lifetime of a system.

Thus, embodiments of the present inventions, it is theorized, minimize, reduce, and avoid these buildups and provide blue, and potentially green, laser systems having the high reliability, small degradation rates, and long lifetimes, as described and taught in this Specification.

Figure 3:
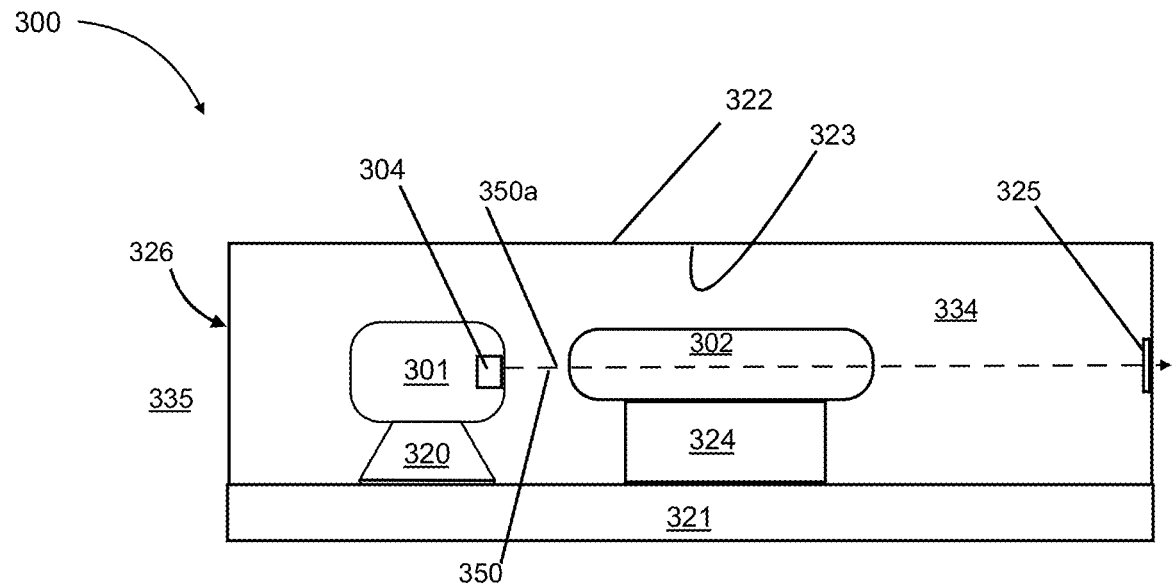
FIG. 3 is a schematic diagram of a laser system in accordance with the present inventions.

Thus, turning to FIG. 3 there is a schematic block diagram of high power, high brightness blue laser system 300. The system 300 has a collection of laser diodes, e.g., emitters, 301. The laser diodes 301 have various mechanical components 320 to mount, position and hold the diodes. These mechanical components 320 are directly or indirectly physically associated with, e.g., attached to, affixed to, etc., a base 321. The base 321 is mechanically associated with a cover 322, which has an inner surface 323. The cover 322 is attached to the base 321 and sealed to the base to form housing 326 that houses or contains an internal cavity 334, that is isolated from the exterior environment 335. There are optical components 302 that are directly or indirectly physically associated with the further mechanical components 324, which are directly or indirectly physically associated with the base 321. The laser diodes 301 and the optical components 302 are contained within the internal cavity 334 are isolated from the exterior environment 335 by the housing 326.

Each of the laser diodes has a facet, e.g., 304 (only one is shown for clarity) from which the blue laser beams are propagated. The laser beam 350 is propagated along laser beam path 350a (it being understood that the laser beam travels along the laser beam path, and thus is coincident with the laser beam path) to the optics 302, and then to, and through a window 325 in housing 326. Thus, the laser beam is propagated through the internal cavity 334 and out of that cavity and into the exterior environment 335.

The internal cavity, of these embodiments, and thus the environment within that cavity and preferable all surfaces within that cavity, are free from sources of silicon based contaminates, such as siloxanes, polymerized siloxanes, linear siloxanes, cyclic siloxanes, cyclomethicones, and poly-siloxanes. In particular, in an embodiment, the surfaces and joints within the housing that are heated during operation, that are exposed to the laser beam, and both, are free from sources of silicon based contaminates. By "free from" it is meant that the amount of contaminate present is so low as to render de minimis, and preferably zero, the amount of Silicon (or specified contaminant) released into the internal cavity during operation. In this manner, it is theorized that the reactive oxygen formed during propagation of the blue laser beam through the interior cavity will have, essentially no, and no Silicon available to react with, and thus, minimize the formation of $SiO_2$, preferably avoid the formation of $SiO_2$, and more preferably will not form $SiO_2$, and, in turn, will minimize $SiO_2$ deposits, avoid $SiO_2$ deposits, and more preferably will not have $SiO_2$ deposits forming on the optically active surfaces within the cavity. The amount of Silicon based contamination is avoided, and thus reduced to such a low level that any available Silicon for forming $SiO_2$ is de minimis, negligible, or below the level that would cause laser degradate rates greater than the embodiments of the present systems. Generally, an optically active surface, is any surface that is contacted by the laser beam and is on the laser beam path, this would include facets, fiber faces, mirrors, lenses, windows, propagations surfaces, and transmission surfaces.

The internal cavity, of these embodiments, and thus the environment within that cavity, however, can contain sources of Carbon based contamination. Thus, all, or most, Carbon based contamination does not need to be removed during assembly, e.g., packaging, of the laser assembly or system. Such Carbon based contamination would include for example, cleaners, solvents, lubricants, oils, human finger prints and oils, and generally any other hydrocarbon source. The internal cavity contains gaseous oxygen, a source of gaseous Oxygen during operation (e.g., a port or flow line in the housing to supply Oxygen to the system during operation), or both. The Oxygen forms reactive atomic oxygen when exposed to the blue laser beam and this reactive Oxygen forms gaseous $CO_2$ by reacting with any Carbon that is released from the Carbon based contamination sources, and thus, minimized, preferably avoids, and more preferably prevents, the deposit, deposition, or buildup of Carbon on the optically active surfaces within the internal cavity.

The internal cavity, of these various embodiments, can have from 1% to 100% Oxygen, from about 5% to about 80% Oxygen, from about 10% to about 50%, from about 30% to about 80% Oxygen, from about 5% to about 30% Oxygen, and the ambient amount of Oxygen present in air (e.g., the internal cavity can contain clean dry air). The other gases in the internal cavity can be, for example, Nitrogen.

The internal cavity, of these embodiments, can have less than 0.01 ppm Silicon, less than 0.001 ppm Silicon, less than 0.0001 ppm Silicon, and lessor amounts, present in, or available to, the internal cavity.

The combination of a blue laser beam, with one and preferably both of gaseous oxygen in the internal cavity, and the absence of sources of Silicon based contamination in the internal cavity, of the laser assembly provides assemblies that can have lifetimes (and also can be accurately characterized, marketed and labeled, as having such lifetimes) of from about 5,000 hours to about 100,000 hours, from about 10,000 hours to about 90,000 hours, from about 5,000 hours to about 50,000 hours, from about 30,000 hours to about 70,000 hours, at least about 20,000 hours, at least about 30,000 hours, at least about 40,000 hours, at least about 50,000 hours and longer times.

These various embodiments of laser systems or assemblies, having these high reliabilities, i.e., these long lifetimes, can provide or propagate blue laser beams (e.g., wavelength of from about 410 nm to about 500 nm, 410 nm to 500 nm, about 405-495 nm, 450 nm, about 450 nm, 460 nm, and about 470 nm). These blue laser beams can have bandwidths of from about 10 pm (picometer) to about 10 nm, about 5 nm, about 10 nm, about 20 nm, from about 10 nm to about 30 nm, from about 5 nm to about 40 nm, about 20 nm or less, about 30 nm or less, about 15 nm or less, about 10 nm or less, as well as greater and smaller values. These blue laser beams can have powers of from about 100 W (Watts) to about 100,000 W, from about 100 W to about 40,000 W, from about 100 W to about 1,000 W, about 200 W, about 250 W, about 500 W, about 1,000 W, about 10,000 W, at least about 100 W, at least about 200 W, at least about 500 W, at least about 1,000 W, and larger and smaller powers. For the packaging of individual diodes, these laser beams can have powers for from about 1 W to about 10 W, about 3 W, about 5 W, about 6 W and about 10 W and greater. These blue laser beams can have BPP of from about 5 mm-mrad to about 50 mm-mrad, less than about 40 mm-mrad, less than about 30 mm-mrad, less than about 20 mm-mrad, less than about 15 mm-mrad, less than about 10 mm-mrad, 20 mm-mrad and lower, and 15 mm-mrad and lower, as well as greater and smaller values. For Raman laser based systems the BPP for these blue laser beams can be less than 5 mm-mrad, less than 1 mm-mrad, from about 0.1 to about 1 mm-mrad, from about 0.1 to about 0.5 mm-mrad, about 0.13 mm-mrad, and about 0.15 mm-mrad.

These laser beams for these various embodiments of laser systems and assemblies can have degradation rates of beam properties (e.g., power, BPP, bandwidth, or other properties of the beam, and combinations of one or more and all of these properties) of about 2.5% per khrs or less, about 2.3% per khrs or less, about 2.1% per khrs or less, about 2.0% per khrs or less, about 1.8% per khrs or less, from about 2.3% per khrs to about 1.5% per khrs, as well as, larger and smaller amounts. In preferred embodiments, these degradation rates are present starting at, based upon, the "normal values" of the properties for the laser, during the lifetime of the laser system, and both. In preferred embodiments these degradation rates are present over the entire lifetime of the system. In more preferred embodiments the laser systems will have a period of their lifetime when the degradation curve, i.e., the plot of the degradation vs time, is flat, i.e., the degradation rate is zero. This period of zero degradation can be from 1 hour to 500 hours and more, can be for a period that is 10% of the lifetime, 20% of the lifetime, 30% of the lifetime and more.

It should be noted that these contaminates form when the lasers are operated at lower powers, as well as high power, over their entire operating range and rated powers. Thus, these degradation rates, unless expressly stated otherwise, are for operation of the laser at rated powers, within rated operating ranges, or at normal and establish operating ranges for such lasers.

It is theorized that there are three primary components that contribute to the build up of deposits on the optically active surfaces, and thus, reduce the lifetime of blue laser systems. These components are Carbon and $SiO_2$. Conventional thinking would suggest that any such deposit contributing components be reduced or eliminated during assembly and packaging. The present inventions go against these conventions, however, buy increasing the amount of Oxygen, which would potentially increase the amount of $SiO_2$ buildup, in order to manage any residual hydrocarbon contamination. In this manner residual hydrocarbon contamination can be present, but the system avoids, and preferably poses no, risk to the system because of the elevated Oxygen levels. The amount of siloxanes are minimized and preferably eliminated. Thus, one of the components needed for $SiO_2$ deposits or buildup is minimized or eliminated; enabling the oxygen to neutralize the hydrocarbon buildup and deposits by forming $CO_2$ instead of the solid Carbon buildup or deposit material. In an embodiment the amount of hydrocarbon contaminates are preferably minimized and can be essentially eliminated.

There are a large number of different cleaning and assembly techniques and procedures known, such as clean room assembly and protocols, solvent washes, extractions, plasma cleaning and the like, that can be used to remove and avoid the presence of any source of silicon based contamination, any source of carbon based contamination and both. The present cleaning and assembly techniques, are an example of many different such techniques and combinations of these techniques, that have applicability to these laser systems; and will have applicability to blue laser systems, shorter wavelength systems, blue-green and green laser systems, and to the high power systems of the present embodiments. In embodiments of the assembly process for the present solid-state lasers, optical assemblies, laser systems and combinations and variations of these, various methods of cleaning and assembling components, can be used to minimize the detrimental effect of the various contamination phenomena that have been discovered for blue and green laser systems, as well as shorter wavelength systems. In embodiments, methods of cleaning and assembling optical components for blue laser systems, and systems having lower and higher wavelengths, are used to mitigate, minimize, or eliminate, the materials that degrade laser performance over time. These assembly processes for a such lasers, optical assemblies and systems address and solve the reliability shortcomings of prior systems. For example, in an embodiment a cleaning method is used to remove silicon based sources of contaminates, which operating methods in embodiments are configured to remove targeted contaminants at specific steps in the assembly process, at specific locations on the components and combinations and variations of these. This cleaning method can provide an embodiment of a package that houses the solid-state laser, optics assembly, laser system (e.g., laser and optics) or combinations of these, preferably having levels of silicon based contaminates that are not detectable by standard analytic techniques. Such packages, which include any of the present embodiments and Examples, can have amounts of silicon based contaminates that are lower than 0.01 g., lower than 0.001 g., lower than 0.0001 g., and lower than 0.00001 g., and lower than 0.000001 g., within the isolated environment of the package. Such packages, which include any of the present embodiments and Examples, can have amounts of silicon based contaminates in the internal cavity (as determined by ppm Silicon based on the constituents of the internal cavity environment, e.g., the gas contained within the internal environment) that are lower than 0.1 ppm Silicon, lower than 0.01 ppm Silicon, less than 0.001 ppm Silicon, lower than 0.0001 ppm Silicon, lower than 0.00001 ppm Silicon, and lower. These systems and methods can have one or more of the following features: wherein there is primarily removed volatile contaminants of poly-siloxanes; wherein there is provided the benefit of removing any residue volatile hydrocarbons; and wherein other operating parameters are selected to remove different contaminants.

In an embodiment of an assembly process, plasma cleaning is used, and in particular plasma cleaning removes trace amounts of contaminants from surfaces of the components in the package, to dislodge contamination or particulates, and for example larger amounts of this contamination or particulates. In an embodiment plasma cleaning is used with a precleaning step, in which precleaning of the surface with carefully selected solvents, both polar and non-polar are used. Preferably, the solvent is chosen so that its polarity matches that of the targeted contaminant. Thus, it is envisioned that multiple precleaning, cleaning and plasma cleaning steps can be performed, and that these steps can be tailored to specific contaminates.

In an embodiment of these assembly processes, system components are heated under reduced pressure for predetermined periods of time to remove residual traces of volatile contaminants, in order to accelerate the outgassing of all volatile components. This preheating step can be, and preferably is, used with the other assembly techniques disclose in the Specification. The operating conditions of temperature and pressure are chosen so that the vapor pressure of the target contaminant is higher than the actual pressure in the oven, while still being safe for the component. This step also ensures that any residue of solvents from the precleaning steps is removed from the component.

An embodiment of the assembly process defines a sequence of precleaning and cleaning, in which it is advantageous to measure the polar and non-polar components of the surface free energy of the parts to be cleaned at different stages of the cleaning process. This provides useful information to select the appropriate combination of solvents and the best gas mixture to target the actual contaminants to be removed. In embodiments a preferred sequence can be different for different components of the assembly, due to the various histories of fabrication, storage and handling of each part.

In an embodiment of the assembly process these cleaning techniques are performed just before packaging, or at the time of packaging, as an additional or secondary, or tertiary cleaning step, e.g., the final cleaning step. It being recognized that even with careful cleaning of the parts and tooling prior to performing the assembly, there exists the possibility that some contamination may be introduced in the package during the integration. This can come, for example, from airborne contaminants present in the assembly area; outgassing from the adhesives during curing is another source of contamination. Therefore, in an embodiment, a final cleaning of the assembly is performed just before sealing the package. The same cleaning methods can be used that are described herein for the individual components.

Figure 9:
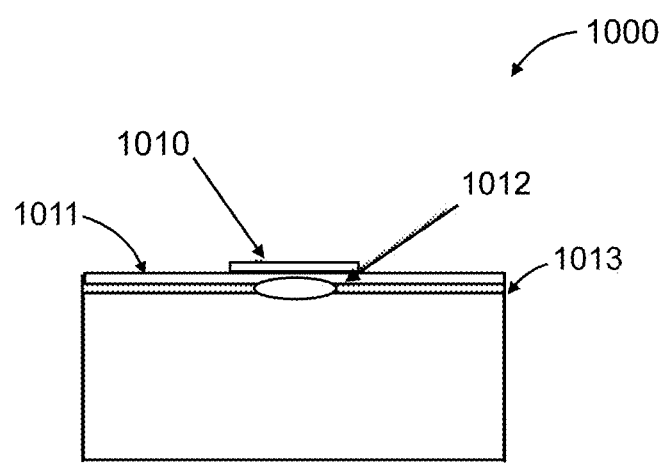
FIG. 9 is a schematic diagram of a diode laser illustrating the typical areas where contamination deposits can occur but are avoided by embodiments of the present inventions in accordance with the present inventions.

Turing to FIG. 9 there is shown a schematic diagram of a laser diode 1000. The diode has a transverse guiding ridge 1010, a front facet 1011, a mode 1012, and vertical confining layers 1013. The contaminants that are formed during operation typically build up along the laser diode vertical confining layer 1013, with the greatest contamination being deposited in the central region of the mode and typically decreasing with the mode intensity in the transverse direction. The embodiments of the present systems and methods provide systems that when operated avoid, minimize and preferably prevent this buildup, as well as other buildups and deposits from occurring.

In order to prevent the ingress of external contaminants, high power laser systems were typically sealed with an inert or protective atmosphere, e.g., atmospheres with little and preferably no Oxygen. This technique however has proven less than effective for blue laser systems, and ineffective for providing long lifetime blue laser systems. It is theorized that the prior use of inert atmosphere is ineffective for blue laser systems, as well as, ineffective for green laser systems, because of the contaminate dissociation effect discussed in this Specification, and it is theorized potentially other phenomenon both understood and not yet fully understood, but who's effects can be seen on the degradation of laser performance, during normal operation of these blue wavelength laser systems, as well as in green laser systems. Further, during operation of these systems the temperature inside the package increases, which also results in outgassing from any component in the assembly; thus, these trace amounts of contaminants, from thermal outgassing, can have a detrimental impact on the reliability of the system, which impact could in some situations be very detrimental.

Having discovered these problems with blue wavelength systems and it is theorized green laser systems as well as shorter wavelength systems, embodiments of the present inventions, provide among other things, examples for appropriate methods to precisely clean, assemble, and both clean and assemble, the system's package or housing, including the optical package (as well as the components within that package, including the solid state laser) during the assembly process and prevent these detrimental processes, and the degradation of the laser system, from taking place.

Another issue, in addition to volatile organic contaminants build up on optical surfaces in the beam path, is the build-up of Silicon Dioxide ($SiO_2$) on the surface of the laser diode facet or other optical components. This build up of Silicon Dioxide results in a change in the coating reflectivity. In some cases the build up of the Silicon Dioxide changes the optical properties of the surface. The single blue laser diode prior to collimation has a very intense optical field at the surface of the laser diode itself. The power density at the facet can exceed 20 MW/cm$^2$ peak due to modal filaments forming in the cavity. It has been discovered and theorized that this high power density is what drives the two photon reaction that dissociates the atmosphere in the package. Once dissociated, the free oxygen atoms rapidly combine with any free Silicon to form $SiO_2$ at the facet. The $SiO_2$ is deposited in a similar manner to Carbon gettering. The process of forming and depositing $SiO_2$ can also proceed throughout other optics including the collimating optics, but due to the much lower power densities at the collimating optics, which can be on the order of a few kW/cm$^2$, the deposition rate is 1,000× less than it is at the facets, but should still be taken in to consideration in the packaging, assembly and cleaning of the system.

The optically active surface of a solid-state laser device of the present systems and assemblies, from which the laser beam is propagated, e.g., a fiber face, a window, or a facet, can have a power density of at least about 0.5 MW/cm$^2$, at least about 1 MW/cm$^2$, at least about 10 MW/cm$^2$, at least about 20 MW/cm$^2$, at least about 50 MW/cm$^2$, at least about 100 MW/cm$^2$, at least about 500 MW/cm$^2$, about 1,000 MW/cm$^2$ or lower, from about 10 MW/cm$^2$ to about 100 MW/cm$^2$, from about 5 MW/cm$^2$ to about 20 MW/cm$^2$, and from about 50 MW/cm$^2$ to about 500 MW/cm$^2$.

Any solid-state device for generating and propagating a laser beam can be used in the present systems and assemblies. Preferably, the solid-state device propagates a laser beam having a wavelength in the blue, blue-green and green wavelengths. Such solid-state laser devices can be, for example, laser diodes, fiber lasers, Raman fiber lasers, and Raman lasers based upon crystal (e.g., diamond, KGW, YVO4, Ba(NO3)2, etc.), and combinations and variations of one or more of these. The present systems can have one, two, three, five, ten, tens, a hundred, hundreds, and thousands of these solid-state devices having their beams combined to provide a high power, high brightness, laser beam for industrial and other applications.

It being understood that although this Specification focusses on complete laser systems, e.g., the solid-state laser device and the optics assembly are combined or integrated into one package or housing, its teaching have equal applicability to a stand-alone laser device with no optics, stand-alone optics assembly with no laser, and combinations and variations of these. These assemblies can be optically integrated, e.g., connected, in the field or before shipment by for example optical fibers with optical connectors.

Embodiments of the present laser devices and systems can be used for industrial applications such as for example for welding components, including components in electronic storage devices.

Since the process which creates the deposits on the facet, and other surfaces, of the laser diode, as well as other optically active surface, that lead to a loss of power are driven by a two photon process, the process can occur whether the devices are pulsed or run CW. A difference between the two operating modes is the rate of deposition of the $SiO_2$ on the facet of the laser diode. The rate of deposition is directly proportional to the power density, the amount of deposit is the integral of this deposition rate over time. Consequently, if the deposition proceeds at a rate of 10 μm per 1,000 hours when operating CW, then it will only deposit 1 μm per 1,000 elapsed hours when operating at a 10% duty cycle. The deposition rate used here is merely an example, it is dependent on a number of other factors, primarily the amount of poly-siloxanes trapped in the package.

Figure 2:
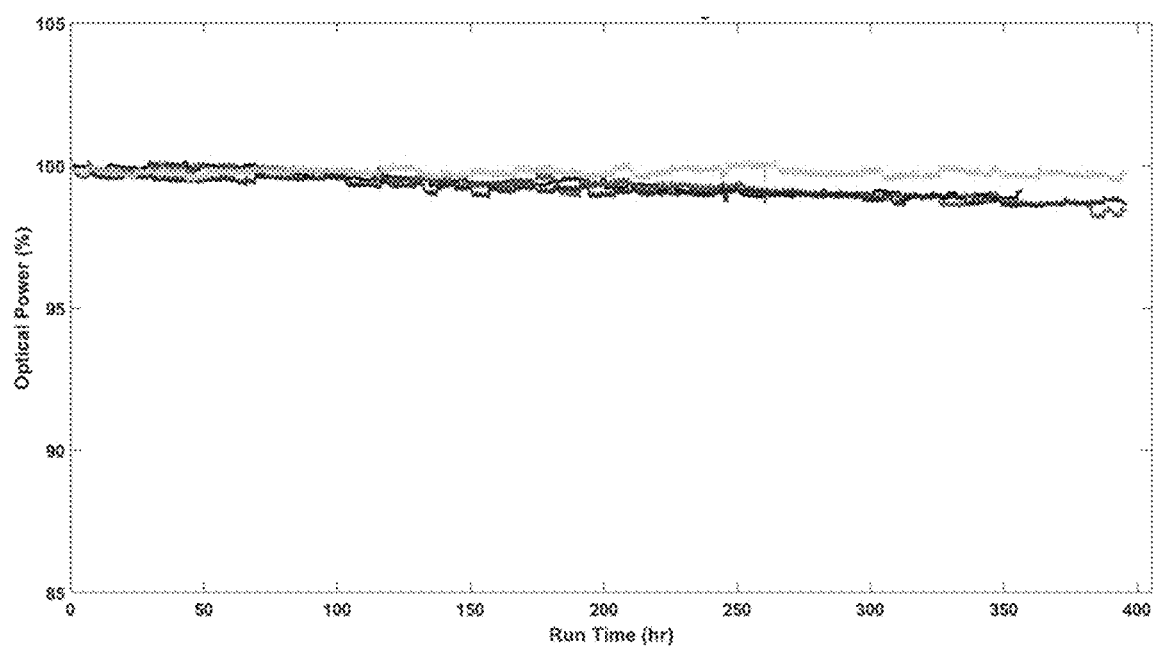
FIG. 2. is a graph of embodiments of improved power output vs time, providing a degradation curve showing the degradation rate, for 5 different high power blue laser systems in accordance with the present inventions.

The comparative example given in FIGS. 1 and 2 uses a 60 W class blue laser composed on 20 single emitter diodes, each being collimated with a fast axis collimation lens to allow coupling into a delivery fiber. The lenses are attached with UV cured optical epoxy after submicron precision alignment. The package is made of gold-plated copper parts, using low temperature solders. The lenses are attached to glass mounts to match the coefficient of thermal expansion. This fairly simple assembly uses 3 different types of optical adhesives, 2 solders, 3 different types of glasses and 2 variations of the gold-plated copper. The assembly process involves multiple steps with different tools and storage containers for the components, which all provide opportunities to contaminate the surfaces. As a result, the interaction of the blue light with the contamination results in a rapid degradation of the output power from the device over time. This is illustrated in FIG. 1, which shows the performance of a typical device over extended testing; the expected lifetime of the laser is only around 200 hours (based on the definition of the time to reach 80% of nominal power), which is clearly not enough for industrial operation. The curve of FIG. 1 exhibits a very typical degradation rate of −100%/khrs, the corresponding lifetime of the device is less than 200 hours.

The devices in both FIG. 1 and FIG. 2 had the same amount of Oxygen, 60%.

It has been discovered that there are at least two blue light interactions in the system that are detrimental to laser performance, and, in particular laser performance over time. First, the scattered light, reflected light and both, from the system heats the surfaces of the system increasing the outgassing from those surfaces and increasing the amount of volatilized contaminates, which in turn increases the amount of those contaminants that are deposited on, and degrade the performance of the laser system. Second, the laser beam, photolyze Oxygen through the two-photon process. The Oxygen atoms then react with both the organics in the package forming $CO_2$, and the poly-siloxanes to from $SiO_2$. In the case of the organics, the $CO_2$ does not deposit on any surfaces and thus, their hydrocarbon source is less of a concern, but the poly-siloxanes are highly detrimental to the reliability. Consequently, the packaging environment (e.g., the inner environment of the housing containing the solid-state laser device, beam path and optics) is assembled and sealed to keep moisture and other contaminates from being introduced to achieve reliable operation.

FIG. 2 shows a graph of the variation of the output power from 5 samples of high-power blue laser devices that were packaged and assembled so as to be free from siloxanes in the internal environment and with an oxygen atmosphere. The laser devices used for the FIG. 2 tests were cleaned using an example of the cleaning sequences according to the present embodiments. The average degradation rate for these devices is −2.3% per khrs which is a 43× improvement of the lifetime compared to the devices of FIG. 1, which were free from siloxanes.

The following examples are provided to illustrate various embodiments of the present assembly methods, laser systems and operations. These examples are for illustrative purposes, may be prophetic, and should not be viewed as, and do not otherwise limit the scope of the present inventions.

Example 1

Figure 10:
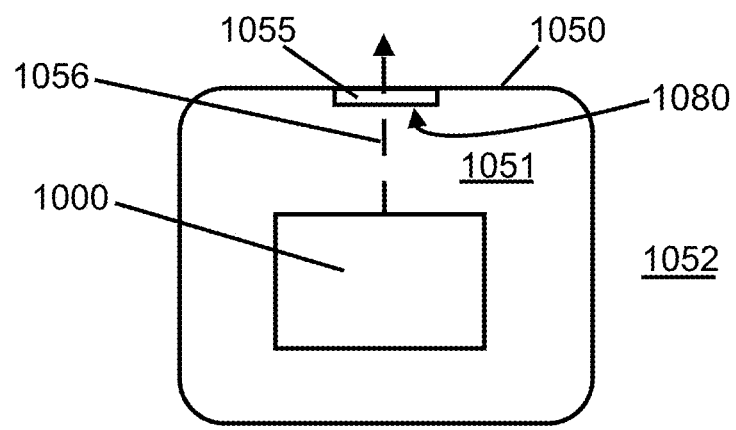
FIG. 10 is a schematic of a diode laser in a package providing an extended lifetime in accordance with the present inventions.

Turning to FIG. 10 there is shown a schematic diagram of the laser diode of FIG. 9 that is assembled into a sealed package that provides for extended lifetime of the diode. This package may then be later integrated into a laser system providing extended lifetime to that system. The diode 1000 is located inside of a sealed housing 1050, that forms the package or packaging for the laser diode, and is a laser diode assembly. The housing 1050 contains an internal environment 1051 that is isolated from an external environment 1052. The diode 1000 propagates a laser beam along a laser beam path 1056 through window 1055 and into the external environment 1052. The inner surface 1080 of the window 1055 is exposed to, and in contact with the internal environment 1051. All the surfaces in the internal cavity are free from silicon based contaminates. The laser beam is in the blue wavelength ranges and has a power of 3 W. The internal environment contains 60% Oxygen, whereby during operation of the solid-state device $CO_2$ is created within the internal cavity from any carbon based contaminates that may be present after cleaning. The packaged assembly has a power degradation rate of less than 2.0% and an laser lifetime of at least 30,000 hours.

Example 1A

In embodiments of Example 1, the internal environment may contain from 1% to 80% Oxygen. The laser beam power may be from about 1 W to about 10 W, The power degradation rate may be less than 3%, less than 2.5%, less than 2% and less than 1.5%. The embodiment may have a laser lifetime of at least 20,000 hours, at least 40,000 hours, at least 50,000 hours, and at least 100,000 hours. In particular, the embodiments may have these lifetimes and degradation rates when assembled into a laser system, e.g., packaged with optics.

Example 1B

The laser diode of Example 1 is a TO-9 Can blue laser diode.

Example 1C

Figure 11:
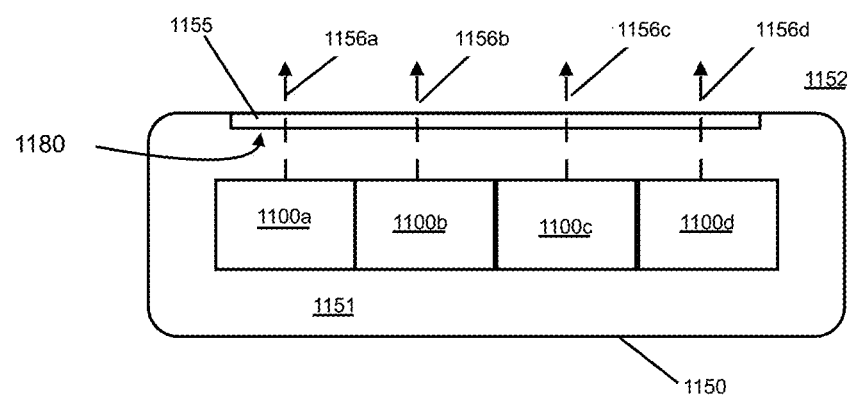
FIG. 11 is a schematic of a laser diode bar in a package providing an extended lifetime in accordance with the present inventions.

Turning to FIG. 11 there is shown a schematic diagram of 4 laser diodes that provide blue laser beams that are assembled into a sealed package that provides for extended lifetime of the diodes. This package may then be later integrated into a laser system providing extended lifetime to that system. The four laser diodes 1100a, 1100b, 1100c, 1100d are packed, e.g., contained, within a housing 1150 that is sealed, and thus, has an internal environment 1151. The housing 1150 protects, and isolates, the internal environment 1151 from an external environment 1152. The four laser diodes propagate blue laser beams having a power of about 5 W that travel along beam paths 1156a, 1156b, 1156c, 1156d. The laser beam travel along their respective beam paths exiting the housing 1150 through window 1155, where they travel into the external environment 1152. The inner surface 1180 of the window 1155 is exposed to, and in contact with, the internal environment 1151. Four separate windows, one for each diode may also be used. All the surfaces in the internal cavity are free from silicon based contaminates. The laser beams are each in the blue wavelength ranges, and each have a power of about 5 W. The internal environment contains 60% Oxygen, whereby during operation of the solid-state device $CO_2$ is created within the internal cavity from any carbon based contaminates that remain after cleaning. The packaged assembly has a power degradation rate of less than 2.0% and a laser lifetime of at least 30,000 hours.

Example 1D

In embodiments of Example 1C, the internal environment may contain from 1% to 80% Oxygen. The laser beam power may be from about 1 W to about 10 W, The power degradation rate may be less than 3%, less than 2.5%, less than 2% and less than 1.5%. The embodiment may have a laser lifetime of at least 20,000 hours, at least 40,000 hours, at least 50,000 hours, and at least 100,000 hours. In particular, the embodiments may have these lifetimes and degradation rates when assembled into a laser system, e.g., packaged with optics.

Example 1E

The laser diodes of Example 1C are TO-9 Can blue laser diodes.

Example 2

Figure 4:
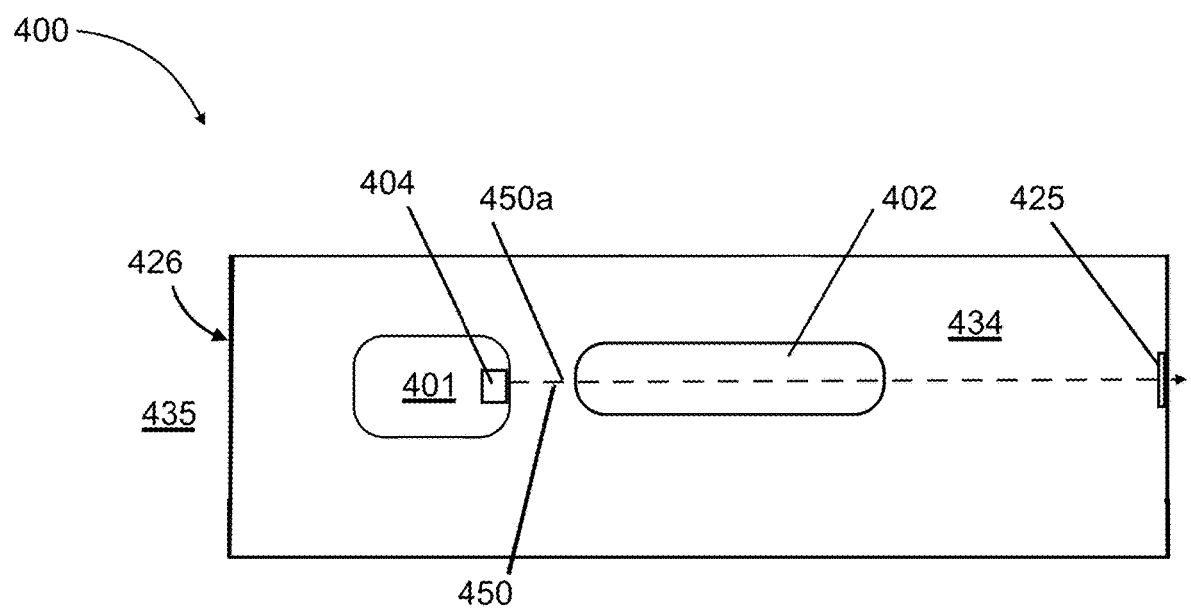
FIG. 4 is a schematic diagram of a laser system in accordance with the present inventions.

Turning to FIG. 4 there is shown a schematic of an embodiment of a high power, high brightness solid-state laser assembly 400, or laser system, for providing a high-quality laser beam 450 over long periods of time without substantial degradation of the laser beam properties, the assembly having: a housing 426 the housing defining an internal cavity 434; wherein the internal cavity is isolated from an environment 435 that is external to the housing; a solid-state device 401 for propagating a laser beam 450 from a propagation surface 404 of the solid-state device along a laser beam path 450a, and wherein the laser beam has a power density of at least about 0.5 MW/cm$^2$ at the propagation surface 404; an optics assembly 402, the optics assembly in optical communication with the solid-state device 401 and on the laser beam path 450a; wherein the solid-state device and the optics assembly are located within the housing 426 and in the internal cavity 434, whereby the solid-state device and the optics assembly are isolated from the external environment 435; the housing comprising a housing propagation surface 425, whereby the laser beam 450 is transmitted from the housing 426 into the external environment 435 along the laser beam path 450a; the housing propagation surface 425 in optical communication with the optics assembly 402 and on the laser beam path 450a; the laser beam upon exiting the housing propagation surface characterized by beam properties, the beam properties comprising: (i) a power of at least 100 W; and, (ii) a BPP of less than 40 mm-mrad; and, the internal cavity being free from sources of silicon based contaminates, whereby during operation of the solid-state device $SiO_2$ is not produced within the internal cavity; whereby the internal cavity remains free of $SiO_2$ build up; thereby the degradation rate of the beam properties is 2.3% per khrs or less.

Example 3

In an embodiment the laser assembly of Example 2 has a solid-state device that produces a laser beam wherein the laser beam has a wavelength in the range of 410 nm to 500 nm.

Example 4

In an embodiment the laser assembly of Example 2 has a solid-state device that produces a laser beam wherein the laser beam has a wavelength in the range of 405 nm to 575 nm.

Example 5

In an embodiment the laser assembly of Example 2 has a solid-state device that produces a laser beam wherein the laser beam has a wavelength in the range of 500 nm to 575 nm.

Example 6

In embodiments of the laser assemblies of Examples 2, 3, 4 and 5 the solid-state device is a Raman fiber laser, a diode laser, a Raman laser based on a crystal and combinations and variations of one or more of these. The optics assembly has optical elements including collimating optics, focusing optics, lenses, mirrors, beam combining optics and combinations and variations of one or more of these. The beam properties further have a bandwidth of about 20 nm or less. The housing propagation surface is a window and a fiber face and combinations and variations of one or more of these. The BPP is less than about 15 mm-mrad; and, the power density at the propagation surface is from about 1 MW/cm$^2$ to about 1,000 MW/cm$^2$.

Example 7

In embodiments of the laser assemblies of Examples 2, 3, 4, 5 and 6 the power of the laser beam is from about 100 W to about 1,000 W. The beam properties further comprise a bandwidth of about 20 nm or less; the power density at the propagation surface is from about 0.5 MW/cm$^2$ to about 1,000 MW/cm$^2$; and, the degradation rate of the beam properties is less than 2.0% per khrs.

Example 8

In embodiments of the laser assemblies of Examples 2-7 and 13-26, the internal cavity comprises a gas consisting of at least 1% Oxygen; whereby during operation of the solid-state device $CO_2$ is created within the internal cavity from carbon based contaminates; whereby the propagation surface of the solid-state device and the optics assembly remain free of Carbon build up.

Example 9

In embodiments of the laser assemblies of Examples 2-7 and 13-26, the internal cavity comprises a gas consisting of at least 5% Oxygen; whereby during operation of the solid-state device $CO_2$ is created within the internal cavity from carbon based contaminates; whereby the propagation surface of the solid-state device and the optics assembly remain free of Carbon build up.

Example 10

In embodiments of the laser assemblies of Examples 2-7 and 13-26, the internal cavity comprises a gas consisting of at least 10% Oxygen; whereby during operation of the solid-state device $CO_2$ is created within the internal cavity from carbon based contaminates; whereby the propagation surface of the solid-state device and the optics assembly remain free of Carbon build up.

Example 11

In embodiments of the laser assemblies of Examples 2-7 and 13-26, the internal cavity comprises a gas consisting of at least 20% Oxygen; whereby during operation of the solid-state device $CO_2$ is created within the internal cavity from carbon based contaminates; whereby the propagation surface of the solid-state device and the optics assembly remain free of Carbon build up.

Example 12

In embodiments of the laser assemblies of Examples 2-7 and 13-26, the internal cavity comprises a gas consisting of from about 5% to at least about 50% Oxygen; whereby during operation of the solid-state device $CO_2$ is created within the internal cavity from carbon based contaminates; whereby the propagation surface of the solid-state device and the optics assembly remain free of Carbon build up.

Example 13

In embodiments of the laser assemblies of Examples 2-12 and 17-26, the degradation rate of the beam properties is 2.0% per khrs or less.

Example 14

In embodiments of the laser assemblies of Examples 2-12 and 17-26, the degradation rate of the beam properties is 1.8% per khrs or less.

Example 15

In embodiments of the laser assemblies of Examples 2-12 and 17-26, the assembly has, and is characterized by, having an extended lifetime of not less than 10,000 hours.

Example 16

In embodiments of the laser assemblies of Examples 2-12 and 17-26, the assembly is characterized by having an extended lifetime of not less than 5,000 hours.

Example 17

Figure 5:
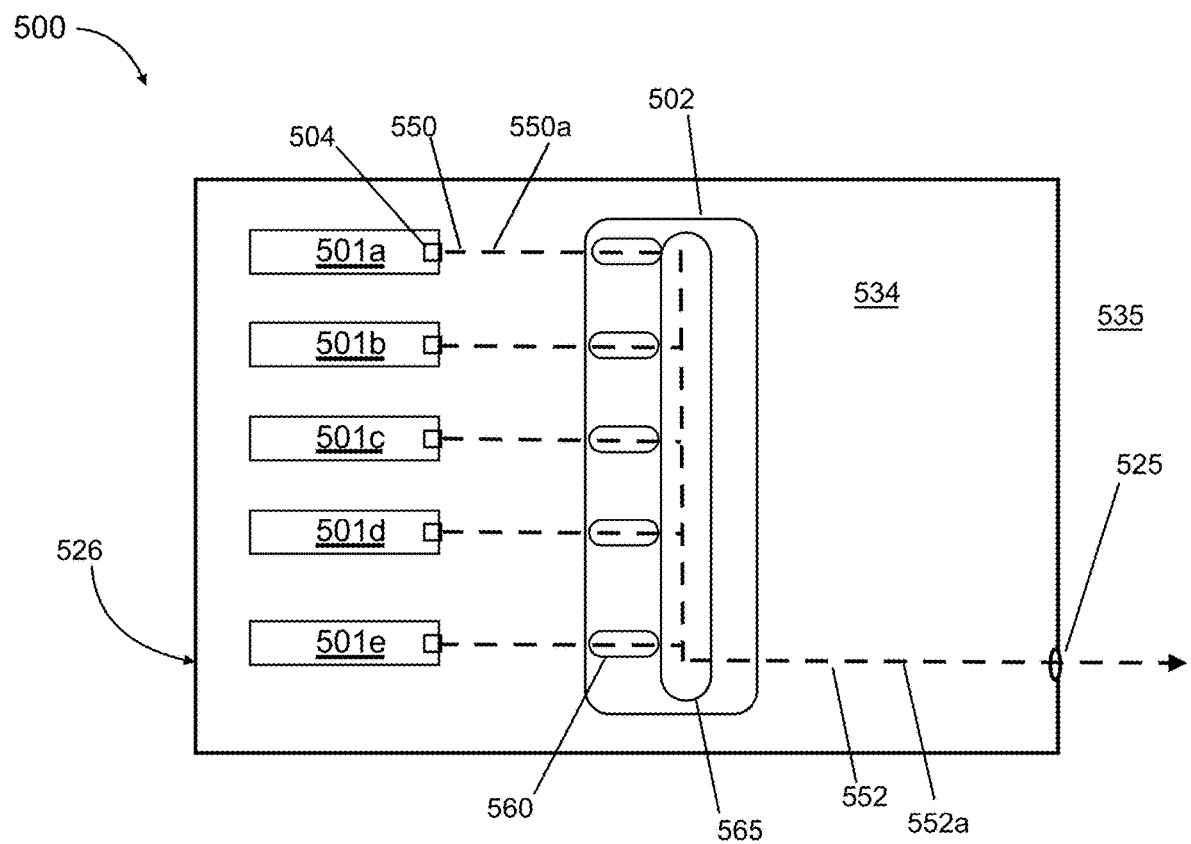
FIG. 5 is a schematic diagram of a laser system in accordance with the present inventions.

Turning to FIG. 5 there is provided a schematic of a high power, high brightness solid-state laser assembly 500, for providing a high-quality blue laser beam 550 over long periods of time without substantial degradation of the laser beam properties, the assembly having: a housing 526, the housing defining an internal cavity 534; wherein the internal cavity is isolated from an environment 535 that is external to the housing 526; a plurality of diode laser devices, 501a, 501b, 501c, 501d, 501e, for propagating a plurality of laser beams, e.g., beam 550, from a plurality of facets, e.g., facet 504, along a plurality of diode laser beam paths, e.g., path 550a, wherein the laser beams have a wavelength in the range of 400 nm to 500 nm; and wherein each laser beam has a power density of at least about 0.5 MW/cm$^2$ at each of the facets; an optics assembly 502, the optics assembly in optical communication with each of the diode laser devices and on the laser beam paths; the optics assembly comprising collimating optics, e.g., collimating optic 560, and beam combining optics 565; the optics assembly 502 combining the plurality of diode laser beams to provide a combined laser beam 552 along a combined laser beam path 552a; wherein the plurality of diode laser devices and the optics assembly are located within the housing 526 and in the internal cavity 534, whereby the plurality of diode laser devices and the optics assembly are isolated from the external environment 535; the housing comprising a housing propagation surface 525, whereby the combined laser beam is transmitted from the housing 526 into the external environment 535 along the combined laser beam path 552a; the housing propagation surface 525 in optical communication with the optics assembly 502 and on the combined laser beam path 552a; the combined laser beam 552 upon exiting the housing propagation surface 525 characterized by beam properties, the beam properties comprising: (i) a power of at least 100 W; and, (ii) a BPP of less than 40 mm mrad; and, the internal cavity 534 being free from sources of silicon based contaminates, whereby during operation of the plurality of diode laser devices $SiO_2$ is not produced within the internal cavity; whereby the internal cavity remains free of $SiO_2$ build up; thereby the degradation rate of the combined beam properties is 2.3% per khrs or less.

Example 18

In embodiments of the laser assemblies of Example 17, and other Examples, the beam properties further comprise a bandwidth of about 15 nm or less; the housing propagation surface is selected from the group consisting of a window and a fiber face; the BPP is less than about 15 mm mrad; and, the power density at the propagation surface is from about 0.5 MW/cm$^2$ to about 1,000 MW/cm$^2$.

Example 19

In embodiments of the laser assemblies of Example 17, and other Examples, the beam properties further comprise a bandwidth of about 15 nm or less; the power of the combined laser beam is at least about 500 W; the housing propagation surface is selected from the group consisting of a window and a fiber face; the BPP is less than about 30 mm mrad; and, the power density at the propagation surface is from about 0.5 MW/cm$^2$ to about 1,000 MW/cm$^2$.

Example 20

Figure 6:
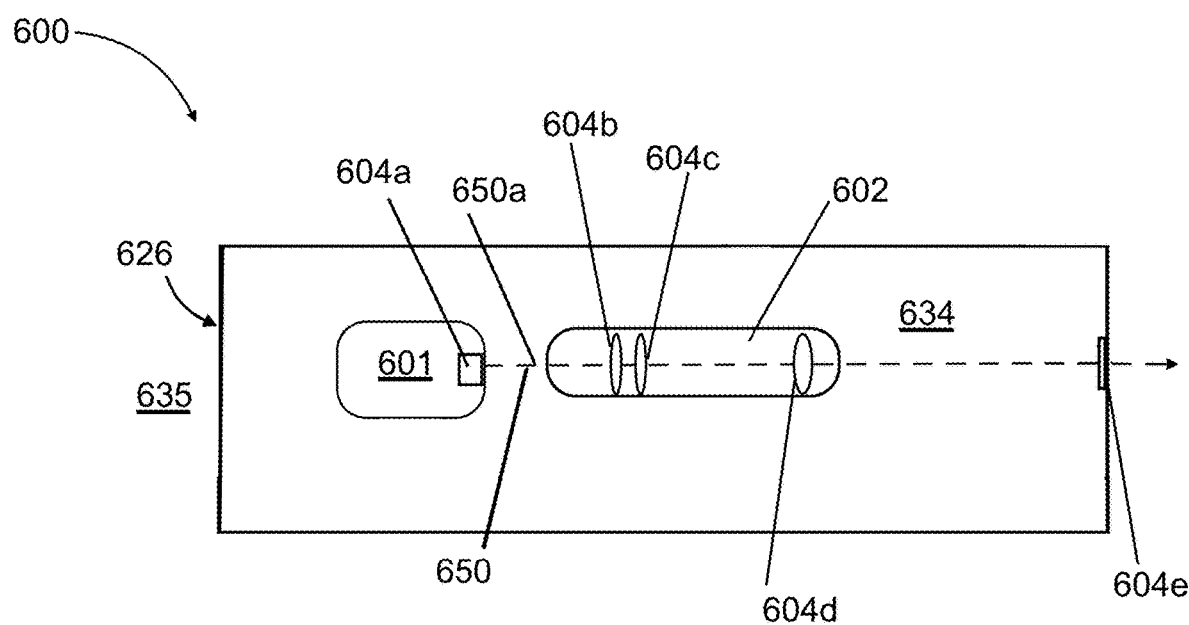
FIG. 6 is a schematic diagram of a laser system in accordance with the present inventions.

Turning to FIG. 6 there is provided a schematic of a high power, high brightness solid-state laser assembly 600, for providing a high-quality blue laser beam 650 along a laser beam path 650a over long periods of time without substantial degradation of the laser beam properties, the assembly having: a housing 626, the housing defining an internal cavity 634; wherein the internal cavity 634 defines an isolated environment; a plurality of optically active surfaces, e.g., surface 604a, surface 604b, surface 604c, surface 604d, surface 604e, wherein a blue laser beam is propagated from, transmitted into or reflected by the optically active surfaces; the plurality of optically active surfaces located within the isolated environment of the internal cavity 634 of the housing; at least one of the optically active surfaces being located on a solid-state laser device 601; wherein the laser beam has a power density of at least about 0.5 MW/cm$^2$ at one or more of the optically active surfaces, e.g., surface 604a, surface 604b, surface 604c, surface 604d, surface 604e; and, the internal cavity 634 being free from sources of silicon based contaminates, whereby during operation of the solid-state laser device $SiO_2$ is not produced within the internal cavity; wherein the internal cavity 634 comprises a gas comprising Oxygen; whereby during operation of the solid-state laser device $CO_2$ is created within the internal cavity from carbon based contaminates; whereby the plurality of optically active surfaces remain free of carbon and $SiO_2$ build up; thereby the degradation rate of a power of the blue laser beam is 2.3% per khrs or less.

Optically active surface 604e is a window providing for transmission of the laser beam 650 out of the housing and into an external environment 635.

Example 21

The laser assembly 600 of FIG. 6 and the laser assembly 500 of FIG. 5, where the solid-state laser produces a laser beam having a wavelength in the green wavelength range.

Example 21A

The green solid-solid state laser of Example 22 is an IR laser system that is doubled in a lithium niobite crystal. The system would have a laser diode, an external cavity and a lithium niobite crystal at the focal point of the external cavity, all of which would be contained within the housing.

Example 22

The laser systems and assemblies of Examples 2-21, 21A, where the laser beams have a band width of about 5 nm, about 10 nm, about 20 nm, from about 10 nm to about 30 nm, from about 5 nm to about 40 nm, about 20 nm or less, about 30 nm or less, about 15 nm or less, about 10 nm or less.

Example 23

The laser systems and assemblies of Examples 2-23, where the laser beam at, or near, the point where the beam exits the housing and propagates into the exterior environment, has powers of from about 100 W to about 100,000 W, from about 100 W to about 40,000 W, from about 100 W to about 1,000 W, about 200 W, about 250 W, about 500 W, about 1,000 W, about 10,000 W, at least about 100 W, at least about 200 W, at least about 500 W, and at least about 1,000 W.

Example 24

The laser systems and assemblies of Examples 2-23, where the laser beam has a BPP of from about 10 mm-mrad to about 50 mm-mrad, less than about 40 mm-mrad, less than about 30 mm-mrad, less than about 20 mm-mrad, less than about 15 mm-mrad, and less than about 10 mm-mrad.

Example 25

The laser systems and assemblies of Examples 2-23, where the sources of silicon based contaminates are siloxanes, polymerized siloxanes, linear siloxanes, cyclic siloxanes, cyclomethicones, poly-siloxanes and combinations and variations of one or more of these.

Example 26

The laser systems and assemblies of Examples 2-25, where the sources of carbon based contaminates are solvent residues, oils, fingerprints, other sources of hydrocarbons and combinations and variations of one or more of these.

Example 27

Embodiments of solid-state, high brightness blue lasers are shown in Table 1. This table shows the power, brightness and performance that can be achieved with 2.5 Watt laser diodes in a two dimensional spectrally beam combined configuration. This table illustrates how the power and brightness of laser systems based on a building block 350 Watt module scales to the multi-kW power level using fiber combiners to launch into a process fiber.

TABLE 1

| Modules | Output Power | BPP (mm-mrad) |
|---|---|---|
| 1 | 350 | 5 |
| 2 | 700 | 13 |
| 3 | 1050 | 14 |
| 4 | 1400 | 15 |
| 5 | 1750 | 17 |
| 6 | 2100 | 19 |
| 7 | 2450 | 19 |
| 8 | 2800 | 21 |
| 9 | 3150 | 23 |
| 10 | 3500 | 24 |
| 11 | 3850 | 25 |
| 12 | 4200 | 27 |
| 13 | 4550 | 27 |
| 14 | 4900 | 28 |
| 15 | 5250 | 29 |
| 16 | 5600 | 30 |
| 17 | 5950 | 31 |
| 18 | 6300 | 32 |

The systems providing the beams of Table 1 have degradation rate of the beam properties that is from about 5% to about 1.5% per khrs or less, 2.5% per khrs or less, 2.0% per khrs or less, 1.8% per khrs or less, 1.0% per khrs or less and smaller values. The systems providing the beams of Table 1 have lifetimes of from at least about 5,000 hours to about 100,000 hours, at least about 5,000 hours, at least about 10,000 hours, at least about 20,000 hours, at least about 40,000 hours from about 10,000 hours to about 50,000 hours and longer lifetimes.

Example 28

The same modules of EXAMPLE 27 may also be combined in free space which conserves brightness but makes module replacement slightly more complicated. The power and beam parameter products that can be achieved with free space combination are shown in Table 2.

TABLE 2

| Output Power | Process Fiber (microns) | BPP (mm-mrad) |
|---|---|---|
| 350 | 45 | 5 |
| 700 | 90 | 9 |
| 1050 | 97 | 10 |
| 1400 | 109 | 11 |
| 1750 | 122 | 13 |
| 2100 | 135 | 14 |
| 2450 | 135 | 14 |
| 2800 | 149 | 16 |
| 3150 | 163 | 17 |
| 3500 | 172 | 18 |
| 3850 | 181 | 19 |
| 4200 | 191 | 20 |
| 4550 | 195 | 20 |
| 4900 | 203 | 21 |
| 5250 | 208 | 22 |
| 5600 | 216 | 23 |
| 5950 | 219 | 23 |
| 6300 | 230 | 24 |

The systems providing the beams of Table 2 have degradation rate of the beam properties that is from about 5% to about 1.5% per khrs or less, 2.5% per khrs or less, 2.0% per khrs or less, 1.8% per khrs or less, 1.0% per khrs or less and smaller values. The systems providing the beams of Table 2 have lifetimes of from at least about 5,000 hours to about 100,000 hours, at least about 5,000 hours, at least about 10,000 hours, at least about 20,000 hours, at least about 40,000 hours from about 10,000 hours to about 50,000 hours and longer lifetimes.

Example 29

Embodiments of solid-state, high brightness blue lasers are shown in Table 3 for systems using a higher power blue laser diode with each device being approximately 6.5 Watts. The base module is now approximately 900 Watts and these modules are combined through fiber combiners to build high power, high brightness blue laser diode systems. As shown in Table 3.

TABLE 3

| Number of Modules | Output Power | BPP (mm-mrad) |
|---|---|---|
| 1 | 882 | 5 |
| 2 | 1,764 | 13 |
| 3 | 2,646 | 14 |
| 4 | 3,528 | 15 |
| 5 | 4,410 | 17 |
| 6 | 5,292 | 19 |
| 7 | 6,174 | 19 |
| 8 | 7,056 | 21 |
| 9 | 7,938 | 23 |
| 10 | 8,820 | 24 |
| 11 | 9,702 | 25 |
| 12 | 10,584 | 27 |
| 13 | 11,466 | 27 |
| 14 | 12,348 | 28 |
| 15 | 13,230 | 29 |
| 16 | 14,112 | 30 |
| 17 | 14,994 | 31 |
| 18 | 15,876 | 32 |

The systems providing the beams of Table 3 have degradation rate of the beam properties that is from about 5% to about 1.5% per khrs or less, 2.5% per khrs or less, 2.0% per khrs or less, 1.8% per khrs or less, 1.0% per khrs or less and smaller values. The systems providing the beams of Table 3 have lifetimes of from at least about 5,000 hours to about 100,000 hours, at least about 5,000 hours, at least about 10,000 hours, at least about 20,000 hours, at least about 40,000 hours from about 10,000 hours to about 50,000 hours and longer lifetimes.

Example 30

Figure 7:
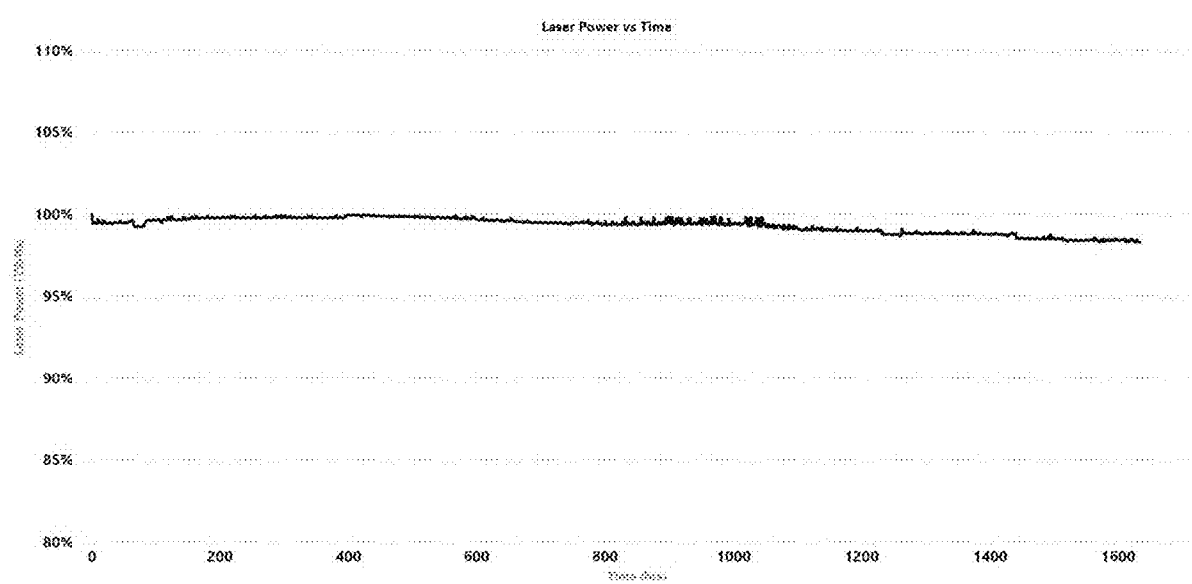
FIG. 7 is a graph of the laser power (as a percentage) vs time of operation (hours) of an embodiment of a laser system in accordance with the present inventions.

Turning to FIG. 7 is a graph of laser power vs operating times. It can be seen that the blue laser diode assembly provides an operating profile where the rate of degradation (plotted line) is slow. The degradation rate has a flat portion at around 200 hrs to around 550 hours. After about 800 hours the rate of degradation is about 0.7% per khr. This rate of degradation shown for the time from 800 to 1,600 hours will remain the same (i.e., the slope of the plotted line will not materially change) for the remainder of the lifetime of the system.

Example 31

Figure 8:
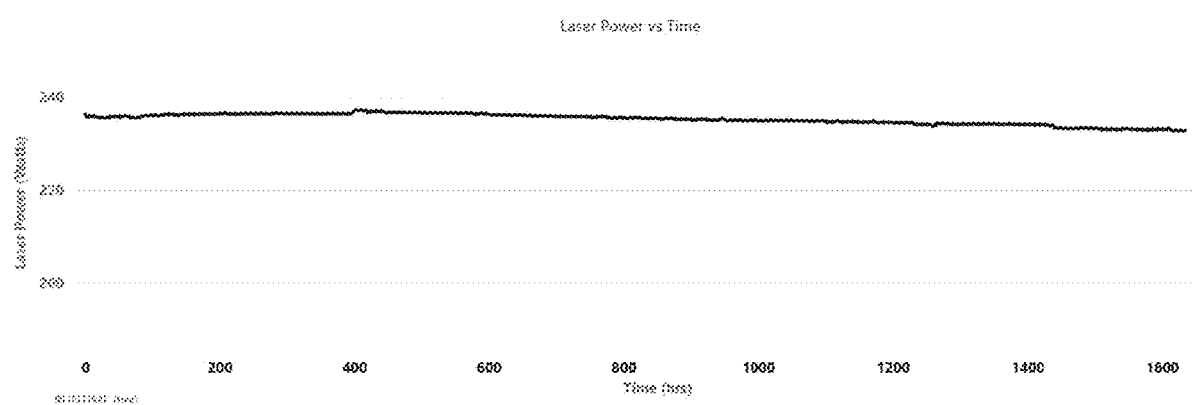
FIG. 8 is a graph of the laser power (Watts) vs time of operation (hours) of an embodiment of a laser system in accordance with the present inventions

Turning to FIG. 8 is a graph of laser power vs operating times. It can be seen that the blue laser diode assembly provides an operating profile where the rate of degradation (plotted line) is slow. The degradation rate has a flat portion at around 150 hrs to around 800 hours. After about 800 hours the rate of degradation is about 0.7% per khr. This rate of degradation shown for the time from 800 to 1,600 hours will remain the same (i.e., the slope of the plotted line will not materially change) for the remainder of the lifetime of the system.

It is noted that there is no requirement to provide or address the theory underlying the novel and groundbreaking performance or other beneficial features and properties that are the subject of, or associated with, embodiments of the present inventions. Nevertheless, various theories are provided in this specification to further advance the art in this important area, and in particular in the important area of lasers, laser processing and laser applications. These theories put forth in this specification, and unless expressly stated otherwise, in no way limit, restrict or narrow the scope of protection to be afforded the claimed inventions. These theories many not be required or practiced to utilize the present inventions. It is further understood that the present inventions may lead to new, and heretofore unknown theories to explain the operation, function and features of embodiments of the methods, articles, materials, devices and system of the present inventions; and such later developed theories shall not limit the scope of protection afforded the present inventions.

The various embodiments of lasers, diodes, arrays, modules, assemblies, activities and operations set forth in this specification may be used in the above identified fields and in various other fields. Additionally, these embodiments, for example, may be used with: existing lasers, additive manufacturing systems, operations and activities as well as other existing equipment; future lasers, additive manufacturing systems operations and activities; and such items that may be modified, in-part, based on the teachings of this specification. Further, the various embodiments set forth in this specification may be used with each other in different and various combinations. Thus, for example, the configurations provided in the various embodiments of this specification may be used with each other. For example, the components of an embodiment having A, A' and B and the components of an embodiment having A", C and D can be used with each other in various combination, e.g., A, C, D, and A. A" C and D, etc., in accordance with the teaching of this Specification. The scope of protection afforded the present inventions should not be limited to a particular embodiment, configuration or arrangement that is set forth in a particular embodiment, example, or in an embodiment in a particular Figure.

The invention may be embodied in other forms than those specifically disclosed herein without departing from its spirit or essential characteristics. The described embodiments are to be considered in all respects only as illustrative and not restrictive.

What is claimed is:

1. A high power, high brightness solid-state laser assembly, for providing a high-quality blue laser beam over long periods of time without substantial degradation of the laser beam properties, the assembly comprising:
 a. a housing, the housing defining an internal cavity; wherein the internal cavity is isolated from an environment that is external to the housing;
 b. a solid-state device for propagating a laser beam from a propagation surface of the solid-state device along a laser beam path, wherein the laser beam has a wavelength in the range of 410 nm to 500 nm; and wherein the laser beam has a power density of at least about 0.5 MW/cm$^2$ at the propagation surface of the solid-state device;
 c. an optics assembly, the optics assembly in optical communication with the solid-state device and on the laser beam path;
 d. wherein the solid-state device and the optics assembly are located within the housing and in the internal cavity, whereby the solid-state device and the optics assembly are isolated from the external environment;
 e. the housing comprising a housing propagation surface, whereby the laser beam is transmitted from the housing into the external environment along the laser beam path; the housing propagation surface in optical communication with the optics assembly and on the laser beam path;
 f. the laser beam upon exiting the housing propagation surface characterized by beam properties, the beam properties comprising: (i) a power of at least 100 W; and, (ii) a BPP of less than 100 mm-mrad;

g. the internal cavity being free from sources of silicon based contaminates, whereby during operation of the solid-state device $SiO_2$ production within the internal cavity is avoided; whereby the internal cavity avoids $SiO_2$ buildup; and,
h. whereby the degradation rate of the beam properties is 2.3% per khrs or less.

2. The assembly of claim 1,
a. wherein the solid-state device is selected from the group consisting of a Raman fiber laser, a diode laser, and a Raman laser based on a crystal; wherein the optics assembly comprises optical elements selected from the group consisting of collimating optics, focusing optics, lenses, mirrors, and beam combining optics;
b. wherein the beam properties further comprise a bandwidth of about 20 nm or less;
c. wherein the housing propagation surface is selected from the group consisting of a window and a fiber face;
d. wherein the BPP is less than about 40 mm-mrad; and,
e. the power density at the propagation surface of the solid-state device is from about 1 $MW/cm^2$ to about 1,000 $MW/cm_2$.

3. The assembly of claim 1,
a. wherein the solid-state device is selected from the group consisting of a Raman fiber laser, a diode laser and a Raman laser based on a crystal; and the power of the laser beam is from about 100 W to about 1,000 W;
b. wherein the beam properties further comprise a bandwidth of about 20 nm or less;
c. the power density at the propagation surface of the solid-state device is from about 0.5 $MW/cm^2$ to about 1,000 $MW/cm^2$ and,
d. the degradation rate of the beam properties is less than 2.0% per khrs.

4. The assembly of claim 1, wherein the internal cavity comprises a gas comprising at least 1% Oxygen; whereby during operation of the solid-state device $CO_2$ is created within the internal cavity from carbon based contaminates; whereby the propagation surface of the solid-state device and the optics assembly avoids Carbon buildup.

5. The assembly of claim 1, wherein the degradation rate of the beam properties is 2.0% per khrs or less.

6. The assembly of claim 1, wherein the degradation rate of the beam properties is 1.8% per khrs or less.

7. The assembly of claim 1, wherein the assembly is characterized by having a lifetime of not less than 10,000 hours.

8. The assembly of claim 1, wherein the sources of silicon based contaminates is selected from the group consisting of siloxanes, polymerized siloxanes, linear siloxanes, cyclic siloxanes, cyclomethicones, and poly-siloxanes.

9. The assembly of claim 4, wherein the sources of carbon based contaminates is selected from the group consisting of solvent residues, oils, fingerprints and hydrocarbons.

* * * * *